(12) United States Patent
Kim et al.

(10) Patent No.: US 8,847,297 B2
(45) Date of Patent: Sep. 30, 2014

(54) IMAGE SENSOR HAVING MOISTURE ABSORPTION BARRIER LAYER, FABRICATING METHOD THEREOF, AND DEVICE COMPRISING THE IMAGE SENSOR

(75) Inventors: Hong-Ki Kim, Hwaseong-si (KR); Ho-Kyu Kang, Yongin-si (KR); June-Taeg Lee, Suwon-si (KR); Jae-Hee Choi, Hwaseong-si (KR)

(73) Assignee: Samsung Electronics Co., Ltd., Gyeonggi-Do (KR)

(*) Notice: Subject to any disclaimer, the term of this patent is extended or adjusted under 35 U.S.C. 154(b) by 65 days.

(21) Appl. No.: 12/977,950

(22) Filed: Dec. 23, 2010

(65) Prior Publication Data
US 2011/0163364 A1    Jul. 7, 2011

(30) Foreign Application Priority Data
Dec. 30, 2009 (KR) .................. 10-2009-0134039

(51) Int. Cl.
*H01L 31/06* (2012.01)
*H01L 27/146* (2006.01)

(52) U.S. Cl.
CPC .... *H01L 27/14618* (2013.01); *H01L 27/14638* (2013.01); *H01L 27/1464* (2013.01); *H01L 27/14687* (2013.01); *H01L 27/14632* (2013.01)
USPC ................ 257/294; 257/E31.12

(58) Field of Classification Search
USPC ............ 257/294, 432, E31.12, E31.128
See application file for complete search history.

(56) References Cited

U.S. PATENT DOCUMENTS

| | | | |
|---|---|---|---|
| 7,365,005 B1 * | 4/2008 | Gadgil | 438/637 |
| 7,803,647 B2 | 9/2010 | Wang et al. | |
| 8,222,710 B2 * | 7/2012 | Hung et al. | 257/443 |
| 2004/0140564 A1 | 7/2004 | Lee et al. | |
| 2005/0088551 A1 * | 4/2005 | Lee et al. | 348/272 |
| 2008/0185174 A1 * | 8/2008 | Bedinger et al. | 174/260 |
| 2008/0191296 A1 * | 8/2008 | Wang et al. | 257/432 |
| 2008/0197391 A1 * | 8/2008 | Dote et al. | 257/295 |
| 2008/0315338 A1 * | 12/2008 | Yeo | 257/431 |
| 2010/0059842 A1 * | 3/2010 | Choi | 257/432 |

FOREIGN PATENT DOCUMENTS

CN    1518119 A    8/2004
CN    101241923 A    8/2008

OTHER PUBLICATIONS

Chinese Office Action for Chinese Patent Application No. 201010614957.7 issued Jun. 6, 2014 with English Translation.

* cited by examiner

*Primary Examiner* — Wensing Kuo
(74) *Attorney, Agent, or Firm* — Harness, Dickey & Pierce, P.L.C.

(57) ABSTRACT

Image sensor, fabricating method thereof, and device comprising the image sensor are provided, which comprises a substrate in which a photoelectric transformation device is formed, an interconnection structure formed on the substrate and including multiple intermetal dielectric layers and multiple metal interconnections placed in the multiple intermetal dielectric layers, the interconnection structure defining a cavity aligned corresponding to the photoelectric transformation device, a moisture absorption barrier layer conformally formed on a top of the interconnection structure and in the cavity; and a light guide unit formed on the moisture absorption barrier layer and including light transmittance material filling the cavity, wherein the moisture absorption barrier layer is formed with a uniform thickness on both sides and a bottom of the cavity and on a top surface of the multiple intermetal dielectric layer.

12 Claims, 27 Drawing Sheets

IMAGE SENSOR HAVING MOISTURE ABSORPTION BARRIER LAYER, FABRICATING METHOD THEREOF, AND DEVICE COMPRISING THE IMAGE SENSOR

CROSS-REFERENCE TO RELATED APPLICATIONS

This application claims priority under 35 U.S.C. §119 to Korean Patent Application No. 10-2009-0134039, filed on Dec. 30, 2009, in the Korean Intellectual Property Office (KIPO), the entire contents of which are incorporated herein by reference.

BACKGROUND

1. Field

Example embodiments relates to an image sensor, a fabrication method thereof, and a device comprising the image sensor.

2. Description of the Related Art

An image sensor transforms photonic images into electrical signals. Recent advances in computer and communication industries have led to strong demands in high performance image sensors in various consumer electronic devices including digital cameras, camcorders, PCS (Personal Communication System), game devices, security cameras, and medical micro cameras.

Specially, an MOS image sensor can be driven easily and implemented using various scanning methods. Also, the size of a product can be minimized since digital signal processing circuits can be integrated into a single chip, and the manufacturing cost can be reduced MOS process technology can be reused. Also, small power consumption makes easy to apply MOS image sensors to battery-powered products. Therefore, with the advances in implementation of high resolution MOS image sensors the use of MOS image sensors has been rapidly increased.

SUMMARY

Example embodiments provide an image sensor with improved photonic characteristics.

Example embodiments also provide a method of fabricating an image sensor with improved photonic characteristics.

However, the aspects, features and advantages of example embodiments are not restricted to the ones set forth herein. The above and other aspects, features and advantages of example embodiments will become more apparent to one of ordinary skill in the art to which example embodiments pertain by referencing a detailed description of example embodiments given below.

According to an aspect of example embodiments, there is provided an image sensor. The image sensor includes a substrate in which a photoelectric transformation device is formed; an interconnection structure formed on the substrate and including multiple intermetal dielectric layers and multiple metal interconnections in the multiple intermetal dielectric layers, the interconnection structure defining at least a portion of cavity aligned corresponding to the photoelectric transformation device; a moisture absorption barrier layer conformally formed on a top of the interconnection structure and in the cavity; and a light guide unit formed on the moisture absorption barrier layer and including light transmittance material filling the cavity, wherein the moisture absorption barrier layer is formed with a uniform thickness on both sides and a bottom of the cavity and on a top surface of the multiple intermetal dielectric layer.

According to another aspect of example embodiments, there is provided an image sensor. The image sensor including a substrate in which a photoelectric transformation device is formed; an interconnection structure formed on the substrate and including multiple intermetal dielectric layers and multiple metal interconnections in the multiple intermetal dielectric layers; an interlayer dielectric layer between the interconnection structure and the substrate and including a gate structure electrically connected to the multiple metal interconnections inside; a moisture absorption barrier layer formed on an entire surface of the substrate including the interconnection structure; and a color filter formed on the moisture absorption barrier layer.

According to another aspect of example embodiments, there is provided an image sensor. The image sensor comprising: a substrate in which a photoelectric transformation device is formed adjacent to a first surface of the substrate; an interconnection structure formed on the first surface and including multiple intermetal dielectric layers and multiple metal interconnections in the multiple intermetal dielectric layers; a backside interlayer dielectric layer formed on a second surface of the substrate which is an opposite side to the first surface; a moisture absorption barrier layer formed on an entire surface of the backside interlayer dielectric layer; and a color filter aligned along the photoelectric transformation device and formed on the moisture absorption barrier layer.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF THE EMBODIMENTS

Figure 1:
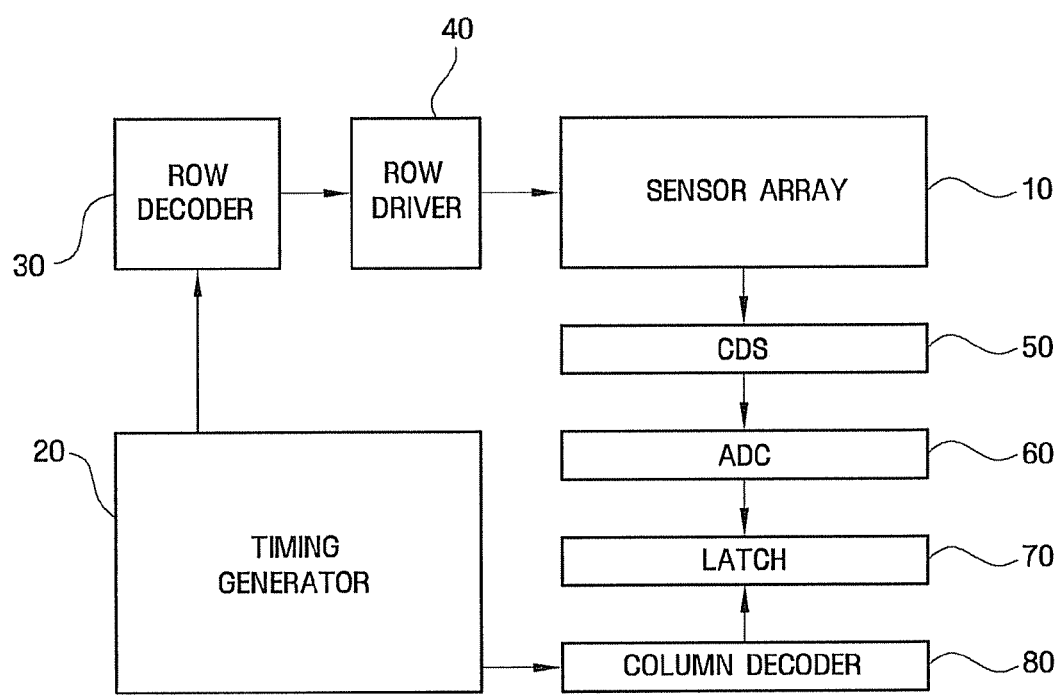
FIG. 1 is a block diagram illustrating an image sensor according to example embodiments.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless explicitly stated otherwise, all of the terminologies (including technical and scientific terminologies) used herein may be used as meaning that those skilled in the art can commonly understand. Further, terminologies defined in ordinary dictionaries should not be ideally or excessively construed, unless explicitly stated otherwise.

Hereinafter, example embodiments are explained by referring to drawings, image sensors and methods of fabricating the same.

FIG. 1 is a block diagram illustrating an image sensor according to example embodiments.

Referring to FIG. 1, an image sensor according to example embodiments includes an sensor array 10 which consists of two dimensional arrays of pixels having photoelectric transformation devices, a timing generator 20, a row decoder 30, a row driver 40, a Correlated Double Sampler CDS 50, an Analog to Digital Converter ADC 60, a latch unit 70, and a column decoder 80.

The sensor array 10 includes unit pixels arranged in two dimensions. The unit pixels transform photonic images into electrical signals. The active pixel sensor (APS) array 10 is driven by multiple driving signals from the row driver 40 including a row selection signal, a reset signal, and a charge transmission signal. Also, the electrically transformed output signals are delivered to the correlated double sampler 50 through vertical signal lines.

The timing generator 20 provides the row decoder 30 and the column decoder 80 with timing and control signals.

According to the decoding results from the row decoder 30 the row driver 40 provides the APS array 10 with multiple driving signals to drive the unit pixels. In general, in case of the unit pixels arranged in a matrix fashion the driving signals are provided to each row.

The correlated double sampler 50 receives the output signals generated from the APS array 10 through vertical signal lines performs hold and sampling operations. In more detailed descriptions, the correlated double sampler 50 double-samples a certain noise level and the signal level generated by the APS array and output a difference level between the noise level and the signal level.

The analog to digital converter 60 outputs digital signals by converting analog signals of the difference level to digital signals.

The latch unit 70 latches the digital signals and the latched signals are sequentially sent to an image signal processor (not shown) according to the decoding results from the column decoder 80.

Figure 2:
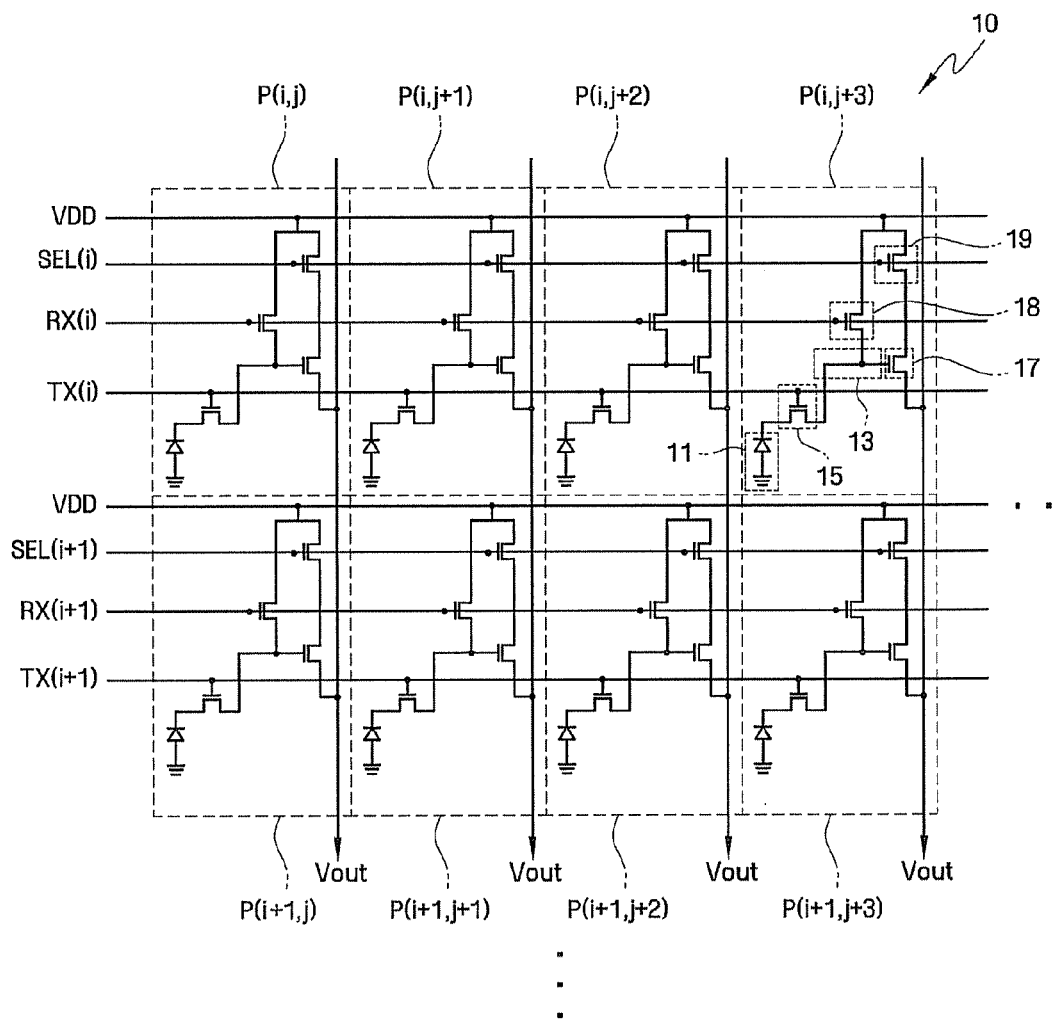
FIG. 2 is an equivalent circuit diagram corresponding to the active pixel sensor (APS) array in FIG. 1.

FIG. 2 is an equivalent circuit diagram corresponding to the APS array in FIG. 1.

Referring to FIG. 2, pixels are arranged in a matrix fashion to form the sensor array 10. Each pixel P includes a photoelectric transformation device 11, a floating diffusion region 13, a charge transmission device 15, a drive device 17, a reset device 18, and a selection device 19. The functionality of these devices are described using an ith row pixel P(i, j), P(i, j+1), P(i, j+2), P(i, j+3), . . . .

The photoelectric transformation device 11 absorbs incident light and accumulates electric charges corresponding to the amount of incident light. The photoelectric transformation device 11 can include a photo diode, a photo transistor, a photo gate, a pinned photo diode, and combinations of these devices. In the drawing, a photo diode is shown.

Each photoelectric transformation device 11 is coupled with the charge transmission device 15 which transmits the accumulated charges to the floating diffusion region 13. The floating diffusion region FD 13 is a region that transforms charges to voltages, and since it has parasitic capacitances the charge is cumulatively stored.

The drive device 17, exemplified as a source follower amplifier, amplifies the changes of electrical potential in the floating diffusion region 13 which receives charges accumulated in each of the photoelectric transformation device 11 and outputs to an output line Vout.

The reset device 18 periodically resets the floating diffusion region 13. The reset device 18 can be comprised of a MOS transistor driven by a bias provided by a reset line RX(i) to apply a bias (for example, reset signal). When the reset device 18 is turned on by the bias provided by the reset line RX(i), the electrical potential applied to a drain of the reset device 18, for example source voltage VDD, is delivered to the floating diffusion region 13.

The selection device 19 selects the pixel P to be read in each row. The selection device 19 can be comprised of a MOS transistor driven by a bias provided by a row selection line SEL(i) to apply a bias (for example, row selection signal). When the selection device 19 is turned on by the bias provided by the row selection line SEL(i), the electrical potential applied to a drain of the selection device 19, for example source voltage VDD, is delivered to a drain of the drive device 17.

The transmission line TX(i) to apply a bias to the charge transmission device 15, the reset line RX(i) to apply a bias to the reset device 18, and the row selection line SEL(i) to apply a bias to the reset device 18 can be extended and arranged in parallel each other in the row direction.

Figure 3:
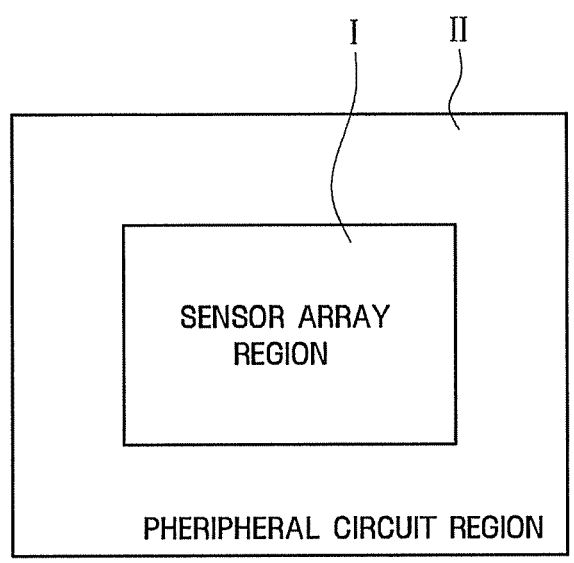
FIG. 3 is a conceptual view illustrating an image sensor according to example embodiments.
Figure 4A:
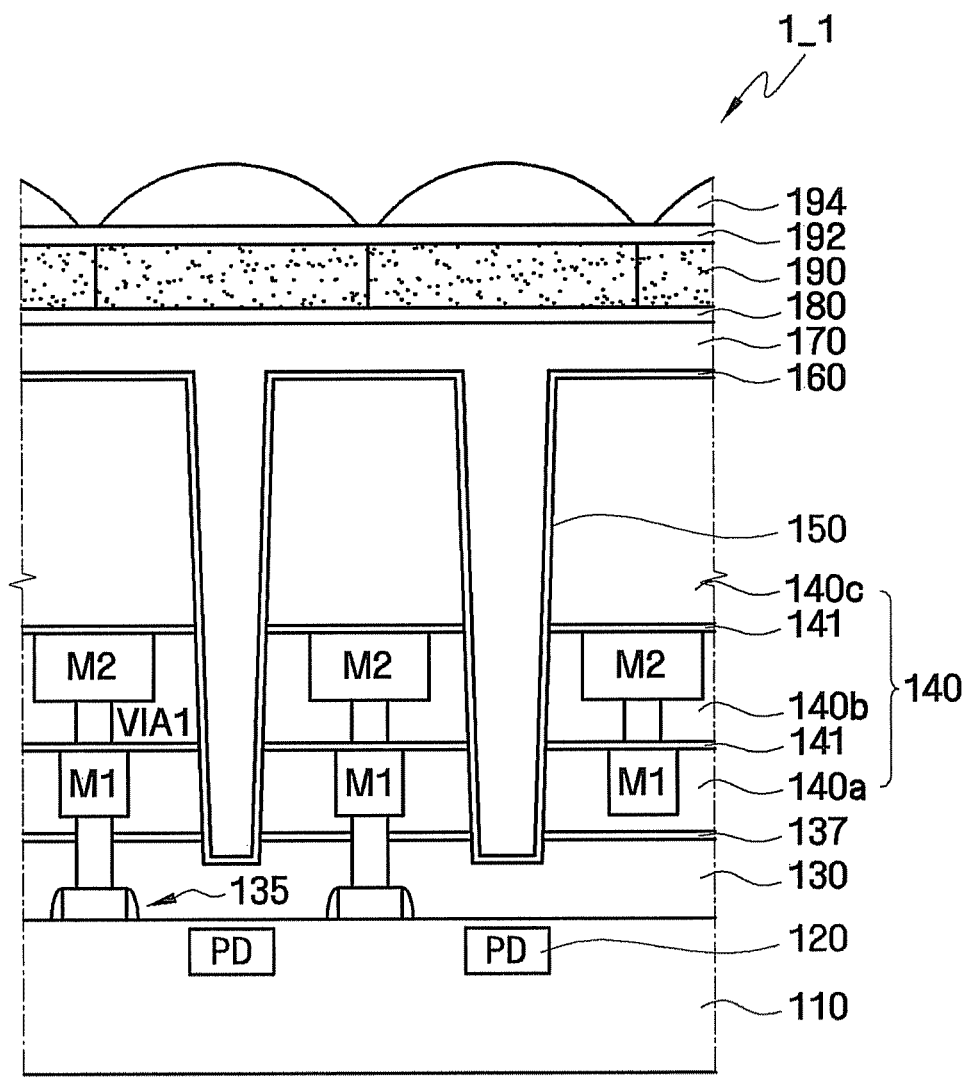
FIGS. 4A and 4B are sectional views illustrating an image sensor according to an example embodiment.
Figure 4B:
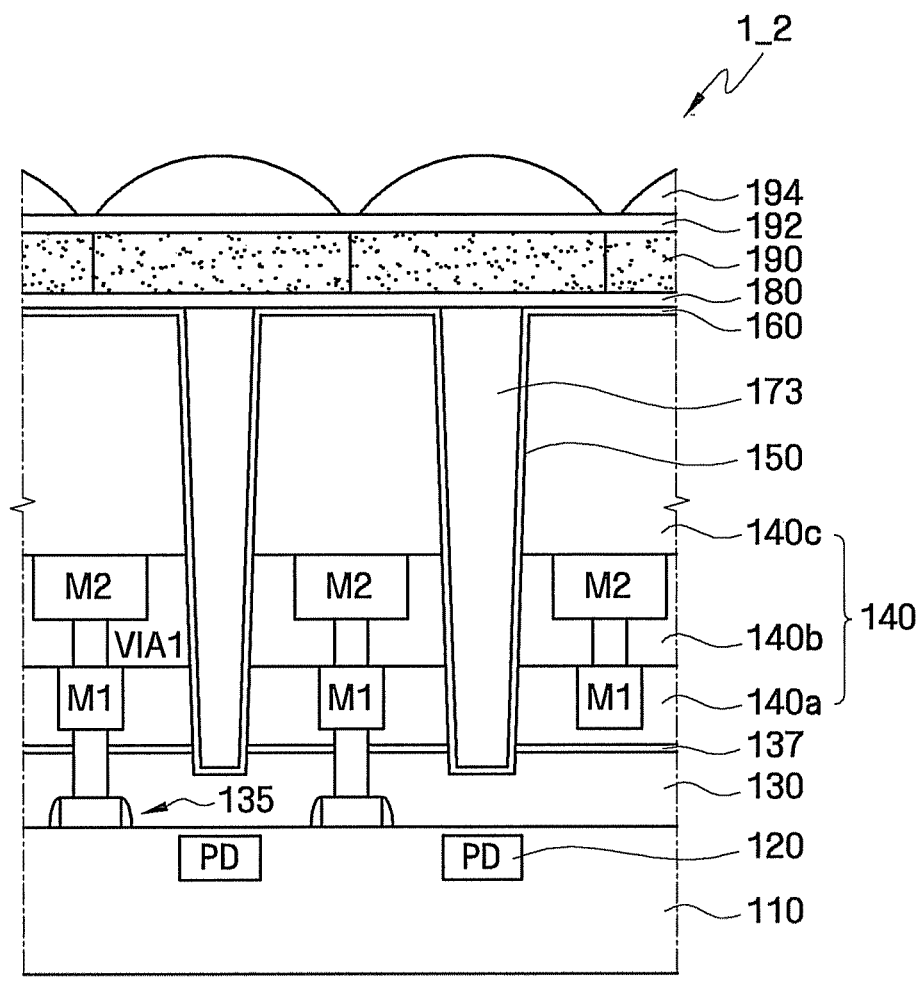
Figure 4C:
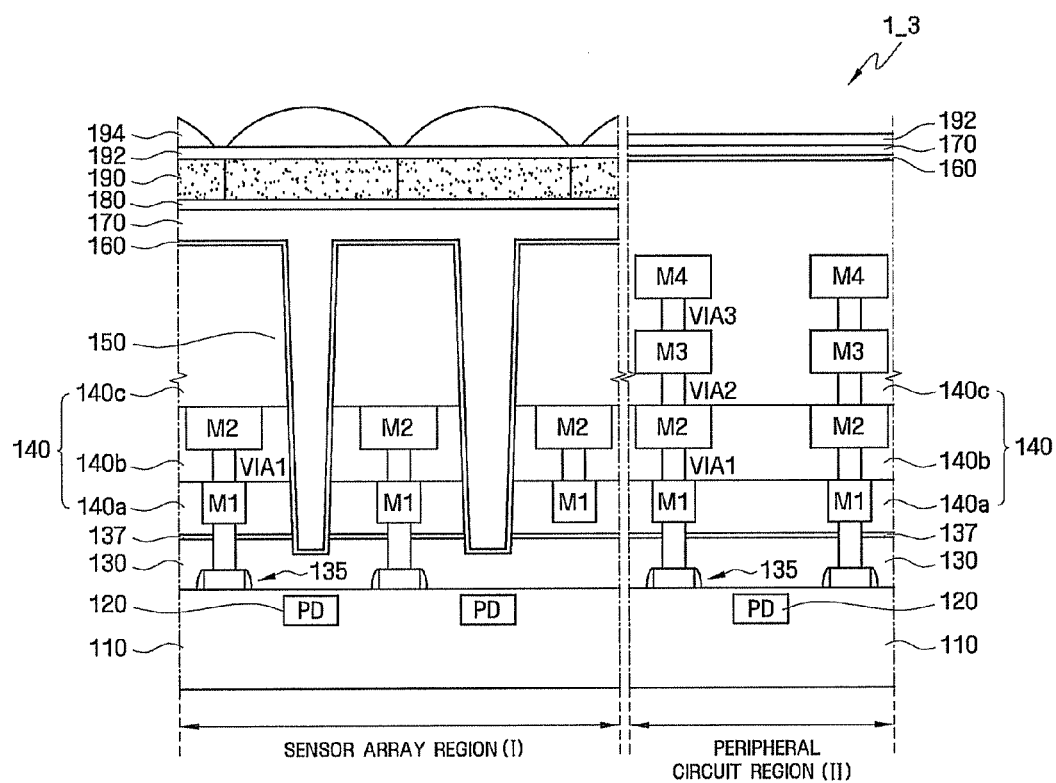
FIG. 4C is a sectional view illustrating an image sensor according a variation of the image sensors of FIGS. 4A and 4B according to an example embodiment.

Hereinafter, referring to FIGS. 3 through 4C, an image sensor according to an example embodiment is described. FIGS. 3 and 4A are conceptual and sectional view illustrating an image sensor according to an example embodiment. FIGS. 4B and 4C are sectional views illustrating image sensors according to other examples of the image sensor illustrated in FIG. 4A. To aid understanding, FIGS. 4A and 4B mainly illustrate a part of a sensor array region with a photoelectric transformation device as the center.

First, referring to FIG. 3 a peripheral circuit region II, for example, can be a region where the Correlated Double Sampler CDS 50 and the Analog to Digital Converter ADC 60, and the latch unit 70 of FIG. 1 are formed, and a sensor array region I can be a region where the sensor array 10 of FIG. 1 is formed. Also, as illustrated in the drawings, the peripheral circuit region II can be formed to surround the sensor array region I; however, it is not limited thereto.

Referring to FIG. 4A, an image sensor 1_1 according to an example embodiment includes a substrate 110, an interconnection structure 140, a cavity 150, a moisture absorption barrier layer 160, and a light guide unit 170.

The substrate 110, for example, can be a first conductive type (for example, p-type) substrate. Although not shown, an epitaxial layer can be formed on the substrate 110, or multiple wells can be formed inside the substrate 110. For example, a SOI (Silicon On Insulator) substrate which includes a bottom silicon substrate, a buried dielectric layer formed on the bottom silicon substrate, a silicon semiconductor layer formed on the buried dielectric layer.

In the substrate 110 a device isolation region (not shown) is formed, and active region can be defined by the device isolation region. The device isolation region can be FOX (Field Oxide) formed by using LOCOS (LOCal Oxidation of Silicon) method or a STI (Shallow Trench Isolation). The device isolation region can divide unit pixels.

In the substrate 110 a photoelectric transformation device 120 is formed. The photoelectric transformation device 120 absorbs light of color that passes through a color filter 190 and generates and/or accumulates charge corresponding to the quantity of light. As the photoelectric transformation device 120, a phototransistor, a photogate, a photodiode, a pinned photodiode, or combination thereof can be used. In this example embodiment a photodiode is used to illustrate the photoelectric transformation device 120. Also, not shown in the drawings, in the substrate 110 a floating diffusion region to read out charges accumulated in the photoelectric transformation device 120 can be formed.

On the substrate 110 an interlayer dielectric layer 130 can be formed, and in the interlayer dielectric layer 130 multiple gate structures 135 can be placed. The interlayer dielectric layer 130 can include a silicon nitride layer and/or a silicon oxide layer. Also, the multiple gate structures, for example, can be transistors. The multiple transistors can include a charge transmission device, a selection device, a drive device, and a reset device. For example, in FIG. 3 read devices can be placed in the sensor array region I and MOS devices, resistors, and capacitors can be placed in the peripheral circuit region II. Since this can be implemented in various forms and the implementations are obvious to those skilled in the art, the descriptions are skipped.

On the interlayer dielectric layer 130 the interconnection structure 140 is formed. The interconnection structure 140 includes multiple layers of intermetal dielectric layers 140a, 140b, and 140c, multiple metal interconnections M1 and M2 placed in the multiple intermetal dielectric layers 140a, 140b, and 140c. The interconnection structure 140 can include the first intermetal dielectric layer 140a, the first metal interconnection M1 formed in the first intermetal dielectric layer 140a, a second intermetal dielectric layer 140b formed on the first metal interconnection M1, a second metal interconnection M2 formed in the second intermetal dielectric layer 140b, and a third intermetal dielectric layer 140c formed on the second metal interconnection M2. Here, the multiple metal interconnections M1 and M2 can be copper interconnections or aluminum interconnections; however, it is not limited thereto. For example, the multiple metal interconnections M1 and M2 can be a damascene interconnection. The multiple layers of the metal interconnections M1 and M2 can be connected through a via contact VIA1.

The first intermetal dielectric layer 140a, the second intermetal dielectric layer 140b, and the third intermetal dielectric layer 140c can be a stacked structure of multiple dielectric layers. For example, the first intermetal dielectric layer 140a can include a silicon nitride layer and/or a silicon nitride layer which are sequentially formed on the interlayer dielectric layer 130.

Also, not shown in drawings, a diffusion barrier layer can be formed in between each of the multiple intermetal dielectric layers 140a, 140b, and 140c. Thus, the diffusion barrier layer can be formed in between the first intermetal dielectric layer 140a and the second intermetal dielectric layer 140b and in between the second intermetal dielectric layer 140b and the third intermetal dielectric layer 140c, respectively. Such diffusion barrier layer prevents metal atoms in the multiple metal interconnections M1 and M2 from diffusion. For example, when the multiple metal interconnections M1 and M2 are copper interconnections, the diffusion barrier layer can prevent diffusion of copper atoms.

Also, the diffusion barrier layer can function as an etch stop layer during forming metal interconnection. Thus, the diffusion barrier layer and the multiple intermetal dielectric layers 140a, 140b, and 140c can have different etch rates. For example, the multiple intermetal dielectric layers 140a, 140b, and 140c can be a silicon oxide layer and the diffusion barrier layer can be a silicon nitride layer. The cavity 150 described later can be formed by penetrating the multiple intermetal dielectric layers 140a, 140b, and 140c including the diffusion barrier layer.

For example, an etch stop layer 137 can be formed in between the interconnection structure 140 and the interlayer dielectric layer 130. The etch stop layer 137 can be formed on the interlayer dielectric layer 130, and the interconnection structure 140 can be formed on the etch stop layer 137. For example, the etch stop layer 137 can include a silicon nitride layer or a silicon oxide layer. The etch stop layer 137 can be used to control the depth of the cavity 150 described later in FIG. 9.

The cavity 150 penetrates the interconnection structure 140 and is aligned along the photoelectric transformation device 120. Specifically, since an interface exists between each of the multiple intermetal dielectric layers 140a, 140b, and 140c formed in multiple layers and the interlayer dielectric layer 130, such interface can prevent light provided by the color filter 190 from arriving at the photoelectric transformation device 120. Also, since the diffusion barrier layer, for example silicon nitride layer, has low light transmittance ratio, it can prevent light from arriving at the photoelectric transformation device 120. Therefore, the cavity 150 formed by penetrating the interconnection structure 140 on the photoelectric transformation device 120 can minimize the obstruction factor and increase quantity of light arriving at the photoelectric transformation device 120 and photosensitivity.

As illustrated in FIG. 4A, the cavity 150 can be formed by penetrating the etch stop layer 137 and a part of the interlayer dielectric layer 130. Also, the cavity 150 has side slope and can be formed to have a width of a bottom narrower than a width of a top. Also, the bottom side of the cavity 150 can be formed to be flat. However, according to example embodiments, the cavity 150 is not limited to the structure illustrated in FIG. 4A. For example, the cavity 150 can be formed to have no side slope, and the bottom side can be formed to be concave or convex rather than flat.

The moisture absorption barrier layer 160 is conformally formed on the cavity 150 formed in the interconnection structure 140. For example, the moisture absorption barrier layer 160 can be formed on an entire surface of the substrate 110 including sidewalls and a bottom side of the cavity 150 except for a part region, for example, a pad region of the peripheral circuit region II. Additionally, the moisture absorption barrier layer 160 can be formed conformally along the intermetal dielectric layer 140c, and not on the sidewalls and the bottom side of the cavity 150.

Although the moisture absorption barrier layer 160 formed on the interconnection structure 140 including the cavity 150 is exposed on relatively high temperature and moisture, it can prevent a saturation level of the sensor array 10 from deteriorating. Here, the saturation level can represent a state where photon charge generated by the photoelectric transformation device 120 using light entering to the photoelectric transformation device 120 exceeds a standard level.

Specifically, the moisture absorption barrier layer 160 can be formed with a material which is resistant to moisture absorption, for example, an aluminum oxide layer (for example, Al2O3) or a titanium oxide layer (for example, TiO2), and can improve device reliability by preventing the saturation level of sensor array 10 from deterioration.

The thickness of the moisture absorption barrier layer 160 can be practically uniform on the substrate 110. Thus, the moisture absorption barrier layer 160 can be formed with uniform thickness on the cavity 150, and it can be formed with uniform thickness on both sides and a bottom of the cavity 150 and on the multiple intermetal dielectric layers 140a, 140b, and 140c. In this step, the thickness of moisture absorption barrier layer 160, for example, can be between about 1 Å and about 2,000 Å.

By forming the moisture absorption barrier layer 160 with uniform thickness on the both sides and the bottom of the cavity 150 and on the multiple intermetal dielectric layers 140a, 140b, and 140c, the profile of the cavity 150 can be maintained substantially identical. As a result, the unnecessary increase of the aspect ratio of the cavity 150 where the moisture absorption barrier layer 160 is formed can be prevented. Therefore, low luminance characteristics due to the increase of the aspect ratio can be improved.

As illustrated in the drawings, due to the cavity 150 a height difference exists in the interconnection structure 140. Since the cavity 150 is formed by penetrating at least a part of the interconnection structure 140, the top layer 140c of the interconnection structure 140, the sidewalls of the cavity 150, and the bottom of cavity 150 forms the height difference. As a result, to form the moisture absorption barrier layer 160 with uniform thickness on the interconnection structure 140 including a height difference, for example, an Atomic Layer Deposition (ALD) having superior step coverage characteristics can be used. When the moisture absorption barrier layer 160 is formed by using the ALD process, compared to the case where it is formed by a plasma process stress applied to the device can be minimized and a dark level can be reduced.

The light guide unit 170 is formed on the moisture absorption barrier layer 160 and includes light transmittance material that fills the cavity 150. Thus, the cavity 150 is filled with light transmittance material, and the light transmittance material is formed on the moisture absorption barrier layer 160. As illustrated in FIG. 4A, the light transmittance material of the light guide unit 170 fills the cavity 150, and can be formed along the upper side of the intermetal dielectric layer 140c which is the top layer of interconnection structure 140. Thus, the moisture absorption barrier layer 160 is conformally formed on both the sidewalls and bottom of the cavity 150 and on the top of interconnection structure 140, and on the moisture absorption barrier layer 160 the light transmittance material can be formed to fill the cavity 150.

The light guide unit 170 can guide incident light that entered the cavity 150 after passing through the color filter 190 to the photoelectric transformation device 120 stably. Thus, to make the incident light pass through easily the light transmittance material, for example, can be comprised of organic polymer compound such as fluoropolymer (Cytop™) having a ring structure, polysiloxane resin, titanium oxide, and PMMA polymer.

Also, the light transmittance material of the light guide unit 170 can be a material that has a higher refractive index than that of a material comprising the multiple intermetal dielectric layers 140a, 140b, and 140c. For example, the refractive index of the light transmittance material of the light guide unit 170 can have a similar refractive index to that of the moisture absorption barrier layer 160. Thus, the incident light entered the light guide unit 170 may be totally reflected inside the cavity 150, and as a result the incident light entered can arrive at the photoelectric transformation device 120 stably. For example, the light transmittance material of the light guide unit 170 can have a refractive index of equal to or above about 1.65.

As illustrated in FIG. 4B, in an image sensor 1_2 according to another example embodiment a light guide unit 173 can be buried in a cavity 150. Thus, unlike the example image sensor illustrated in FIG. 4A where the light guide unit 173 is formed along a top of an interconnection structure 140, the light guide unit 173 can be placed in the cavity 150. Here, light transmittance material of the light guide unit 173 fills the cavity 150, and the light transmittance material can only exist in the space formed by the cavity 150. As illustrated in the drawings, the top surface of the light transmittance material can exist substantially on the same plane as that of the top surface of the interconnection structure 140.

Furthermore, although not shown in the drawings, in another example embodiment, a top surface of light transmittance material can exist on a different plane with respect to that of the top surface of an interconnection structure 140. For example, when the light transmittance material of a light guide unit 173 fills a cavity 150 partially, the top surface of the light transmittance material can exist on the different plane as that of the top surface of the interconnection structure 140. In this step, a moisture absorption barrier layer 160 can be formed conformally along the top surface of the light transmittance material and the interconnection structure 140. In this case, by using a subsequent process including forming a planarization layer the height difference can be supplemented.

Referring to FIGS. 4A and 4B, on the light guide unit 170 and 173 a lower planarization layer 180, a color filter 190, an upper planarization layer 192, a lens 194, and a protection layer can be formed sequentially. In FIG. 4A, although it is illustrated that planarization layers 180 and 193 are formed on both the upper and lower sides of the color filter 190, it is not limited thereto. For example, a planarization layer 192 can be formed only on the upper side of the color filter 190, and no planarization layer can be formed on both the upper and lower sides.

The lens 194 can be comprised of organic material such as photosensitive resin or inorganic material. When the lens 194 is formed with organic material, for example an organic material pattern can be formed on the upper planarization layer 192 followed by thermal process to form the lens 194. By the thermal process, the organic material pattern turns into a lens shape.

Although not shown in the drawings, on the lens 194 a protection layer can be formed. The protection layer can protect the lens 194 from external shock. The protection layer can be an inorganic oxide layer. For example, a silicon oxide layer, a titanium oxide layer, a zirconium oxide layer ($ZrO_2$), a hafnium oxide layer ($HfO_2$), or a stacked layer or a combination layer thereof can be used. In particular, as the protection layer LTO (Low Temperature Oxide) which is a type of a silicon oxide layer. The LTO is used because the LTO is fabricated in a low temperature of about 100° C. to about 200° C. and as a result lower layers can have less damage. Also, since the LTO is amorphous, it is not rough. Therefore, the reflection/refraction/scattering of the incident light can be reduced.

When the lens 194 is comprised of organic material, it can be weak to external shock. Thus, the protection layer can protect the lens 194 from external shock. Small space can exist between the neighboring lenses 194, and the protection layer can fill the space. When the space between the neighboring lenses 194 is filled, the capability of incident light concentration can be improved. This is because the reflection/refraction/scattering of the incident light arriving at the space between the neighboring lenses 194 can be reduced.

Furthermore, on the light transmittance material of the light guide unit 170 an adhesive layer (not shown) can be formed additionally. The adhesive layer can improve the adhesion capability between the lower light guide unit 170 and the upper color filter 190 and provide more stable bond between the light transmittance material and the color filter 190.

An image sensor according to example embodiments includes a moisture absorption barrier layer conformally formed on an interconnection structure having a cavity formed and prevents a saturation level of a sensor array from deterioration due to moisture absorption. As a result, the reliability of image sensor can be improved. Also, when the moisture absorption barrier layer is formed by ALD process, the device impact of stress can be minimized and a dark level can be improved. Furthermore, since the conformally formed moisture absorption barrier layers have substantially identical thickness, step coverage of a height difference region comprising especially a top of the interconnection structure, sidewalls of the cavity, and a bottom of the cavity is excellent. As a result, unnecessary aspect ratio increase can be prevented, and low luminance sensitivity characteristics can be more improved.

Referring to FIG. 4C, according to an image sensor 1_3 according to a variation of the examples discussed above with reference to FIGS. 4A and 4B, on a peripheral circuit region II of a substrate 110 a interlayer dielectric layer 130, an interconnection structure 140, and a moisture absorption barrier layer 160 can be formed. As described above, moisture absorption barrier layer 160 can be formed on the entire substrate 110, except at least part of the substrate 110, for example, a pad region of a peripheral circuit region II. In FIG. 4C, although it is illustrated that the example structure illustrated in FIG. 4A is applied to a sensor array region I, it is not limited thereto and various structures can be applied.

Also, on the moisture absorption barrier layer 160 formed on the peripheral circuit region II light transmittance material of a light guide unit 170 and an upper planarization layer 192 can be stacked sequentially. However, depending on the structure of a sensor array region I the material stacked on the moisture absorption barrier layer 160 can vary. For example, when only a lower planarization layer 180 is formed on the moisture absorption barrier layer 160 of the sensor array region I, only the lower planarization layer 180 is formed on the moisture absorption barrier layer 160 of the peripheral circuit region II. Since this is an example, various methods can be applied. Also, as illustrated in FIG. 4C, in the peripheral circuit region II more layers of metal interconnections M1, M2, M3, and M4 can be formed compared to the sensor array region I. Furthermore, the metal interconnections M1, M2, M3, and M4 can be connected electrically via contacts VIA 1, VIA2, and VIA3.

Figure 5A:
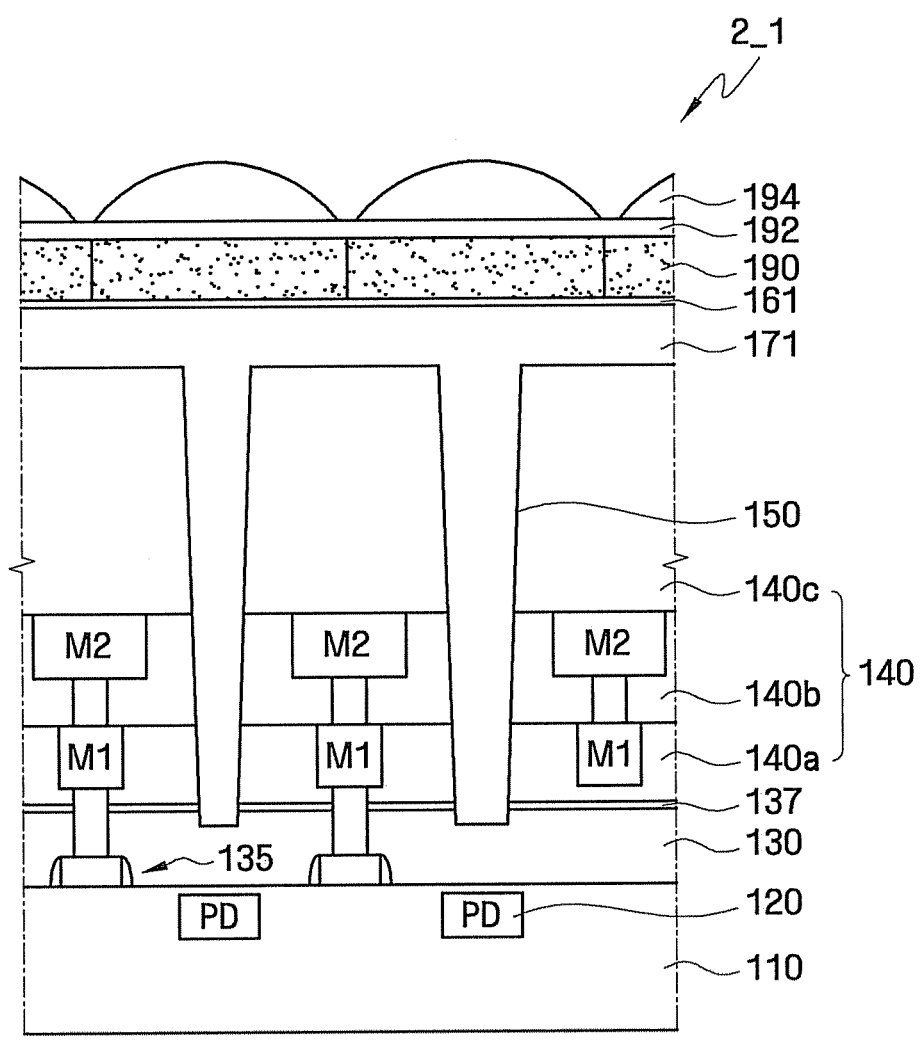
FIGS. 5A and 5B are sectional views illustrating an image sensor according to another example embodiment.
Figure 5B:
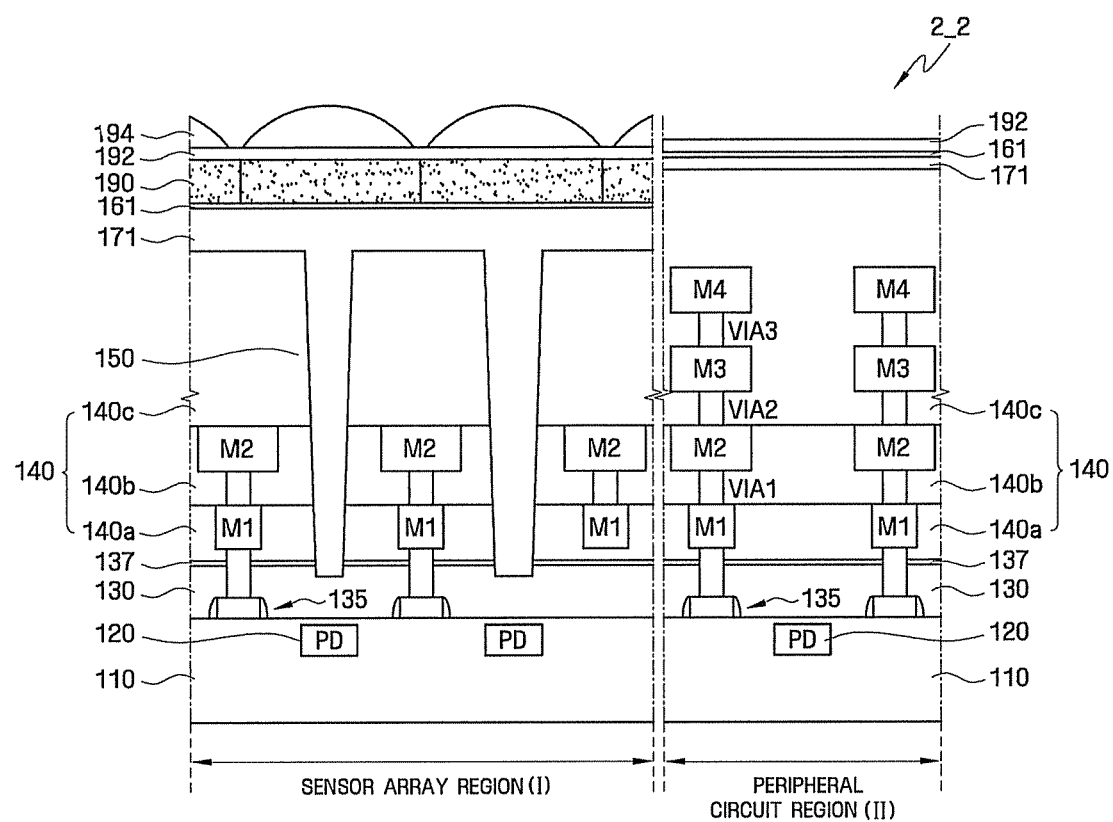

Referring to FIGS. 5A and 5B, image sensors 2_1 and 2_2 according to another example embodiment are described. FIGS. 5A and 5B are sectional views illustrating image sensors according to another example embodiment. To aid understanding, FIG. 5A mainly illustrates a photoelectric transformation device and part of a sensor array region.

Referring to FIG. 5A, an image sensor 2_1 according to another example embodiment is differentiated from others such that a moisture absorption barrier layer 161 is formed between light transmittance material and a color filter 190. Hereinafter, like reference numerals refer to like elements throughout the specification, and for the content that is to the same as that of example embodiments discussed above with reference to FIGS. 4A-C, descriptions are skipped or simplified.

On an interconnection structure 140 having a cavity 150 formed a light guide unit 171 including the light transmittance material is formed. Specifically, inside the cavity 150 is filled with the light transmittance material of a light guide unit 171. The light transmittance material is extended to a top of the interconnection structure 140 and formed on an entire surface of a substrate 110 including the interconnection structure 140. As described earlier, in the example image sensors illustrated in FIGS. 4A-4C, the light transmittance material of the light guide unit 171 can be formed to be buried in the cavity 150, and the lower planarization layer (refer to 180 of FIG. 4C) can be formed on a top intermetal dielectric layer 140C of interconnection structure 140 and on the light transmittance material.

On the light transmittance material of the light guide unit 171 formed inside the cavity 150 and on the top of the interconnection structure 140 the moisture absorption barrier layer 161 is formed. The moisture absorption barrier layer 161, for example, can include aluminum oxide layer or titanium oxide layer; however, it is not limited thereto if an ALD process can be applied to the material. Also, the moisture absorption barrier layer 161 can include material which is resistant to moisture absorption.

The moisture absorption barrier layer 161 can be formed on the light transmittance material of the light guide unit 171 with substantially identical thickness, and for example the thickness can be about between 1 Å and about 2000 Å.

Furthermore, on the moisture absorption barrier layer 161 the color filter 190 is formed.

Referring to FIG. 5B, on a sensor array region I of the substrate 110 a structure of FIG. 5A is formed, and on a peripheral circuit region II a interlayer dielectric layer 130, the interconnection structure 140, the light transmittance material of the light guide unit 171, and the moisture absorption barrier layer 161 can be formed. As described above, the moisture absorption barrier layer 161 can be formed on a part or an entire of substrate 110. Therefore, on the sensor array region I and the peripheral circuit region II the moisture absorption barrier layer 161 having the identical thickness and material can be formed.

An image sensor according to another example embodiment includes a moisture absorption barrier layer formed on light transmittance material of a light guide unit, and since it can prevent a saturation level of a sensor array from deterioration, a reliability of an image sensor can be improved. Also, when the moisture absorption barrier layer is formed by using ALD process, stress to device can be reduced and as a result a dark level can be improved.

Figure 6A:
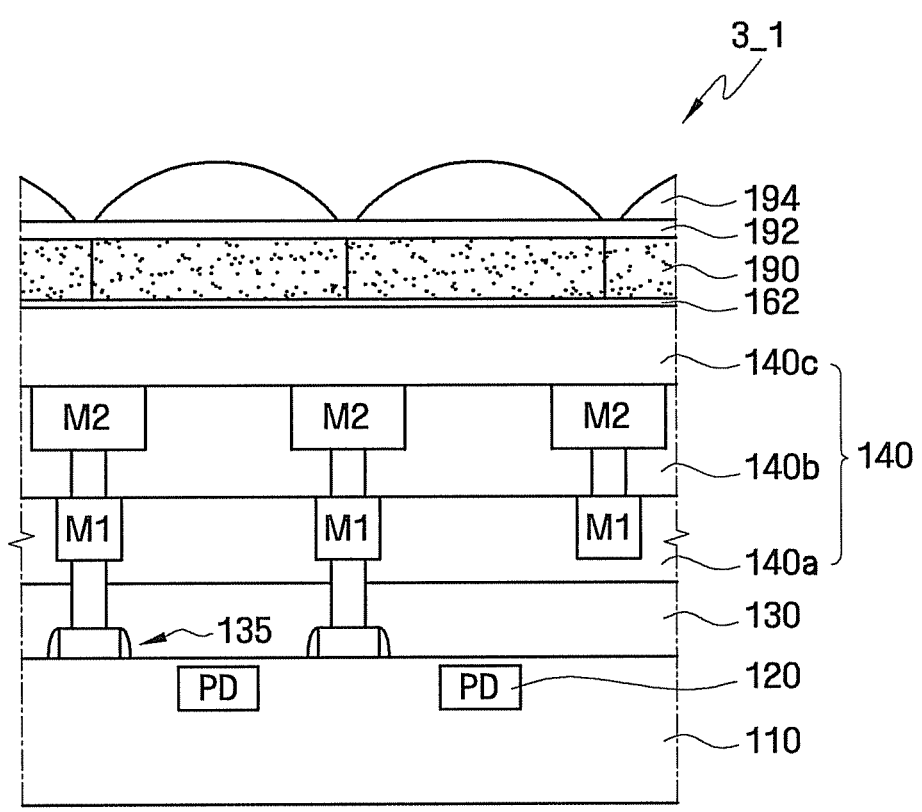
FIGS. 6A and 6B are sectional views illustrating an image sensor according to another example embodiment.
Figure 6B:
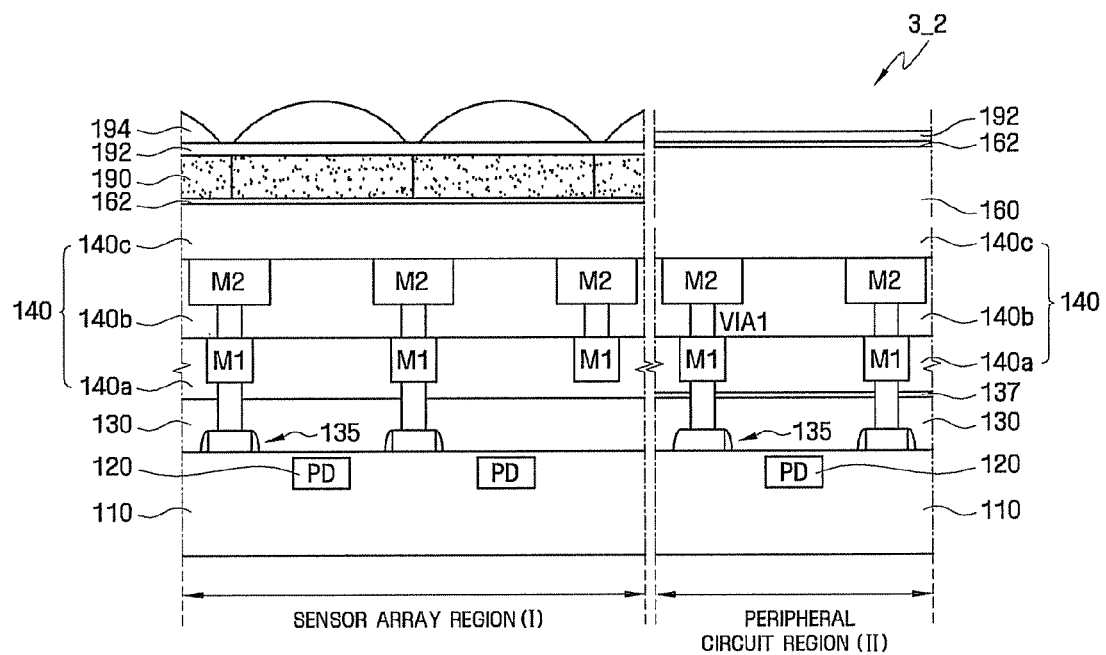

Referring to FIGS. 6A and 6B, image sensors 3_1 and 3_2 according to another example embodiment are described. FIGS. 6A and 6B are sectional views illustrating image sensors according to another example embodiment. To aid understanding, FIG. 6A mainly illustrate a part of a sensor array region with a photoelectric transformation device as a center.

Referring to FIG. 6A, an image sensor 3_1 according to another example embodiment is differentiated from example image sensors illustrated in FIGS. 4A-5B described earlier such that a cavity (refer to 150 of FIG. 5) is not formed inside an interconnection structure 140, and a moisture absorption barrier layer 162 is formed between the interconnection structure 140 and a color filter 190.

As illustrated in FIG. 6A, in another image sensor 3_1 according to example embodiments the moisture absorption barrier layer 162 is formed between the interconnection structure 140 and the color filter 190. For example, the moisture absorption barrier layer 162 can be formed directly on a top of the interconnection structure 140.

Also, since a cavity is not formed inside the interconnection structure 140, stress to device that can occur during a cavity formation process, for example plasma treatment process can be reduced, and as a result a reliability of a device can be improved.

Figure 7A:
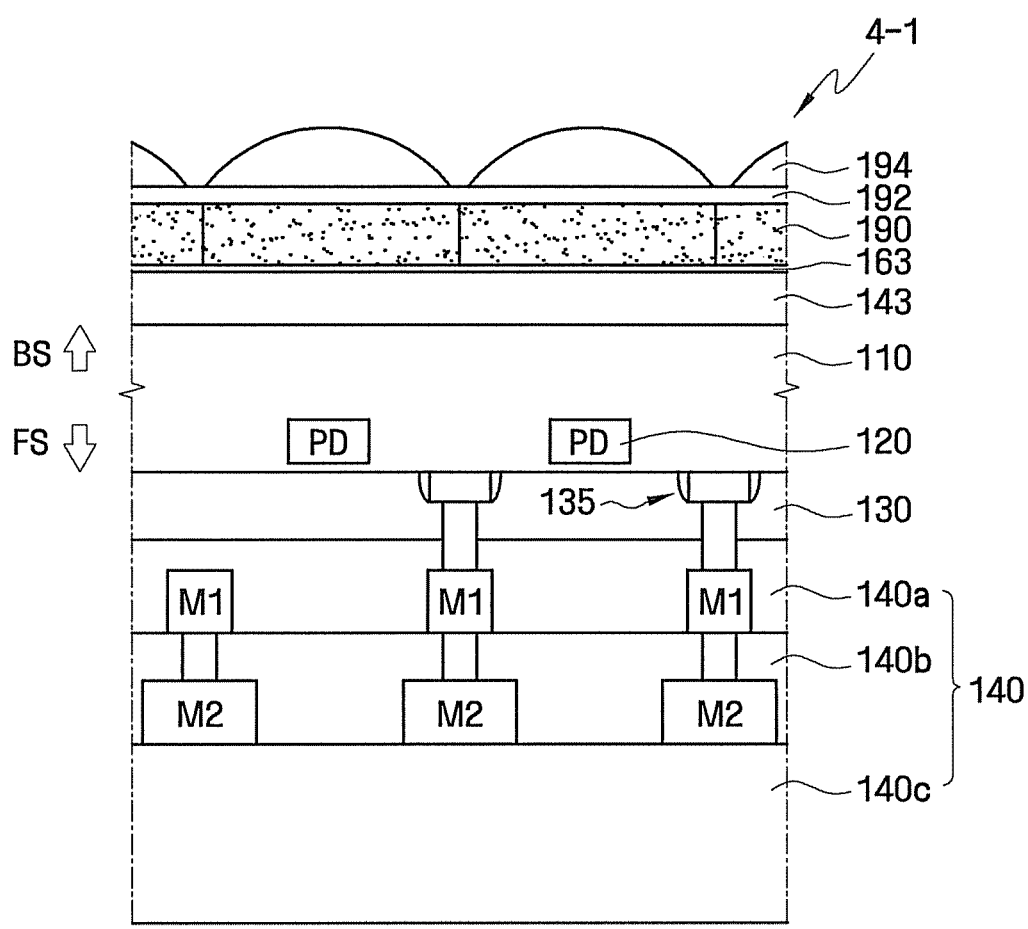
FIGS. 7A and 7B are sectional views illustrating an image sensor according to another example embodiment.
Figure 7B:
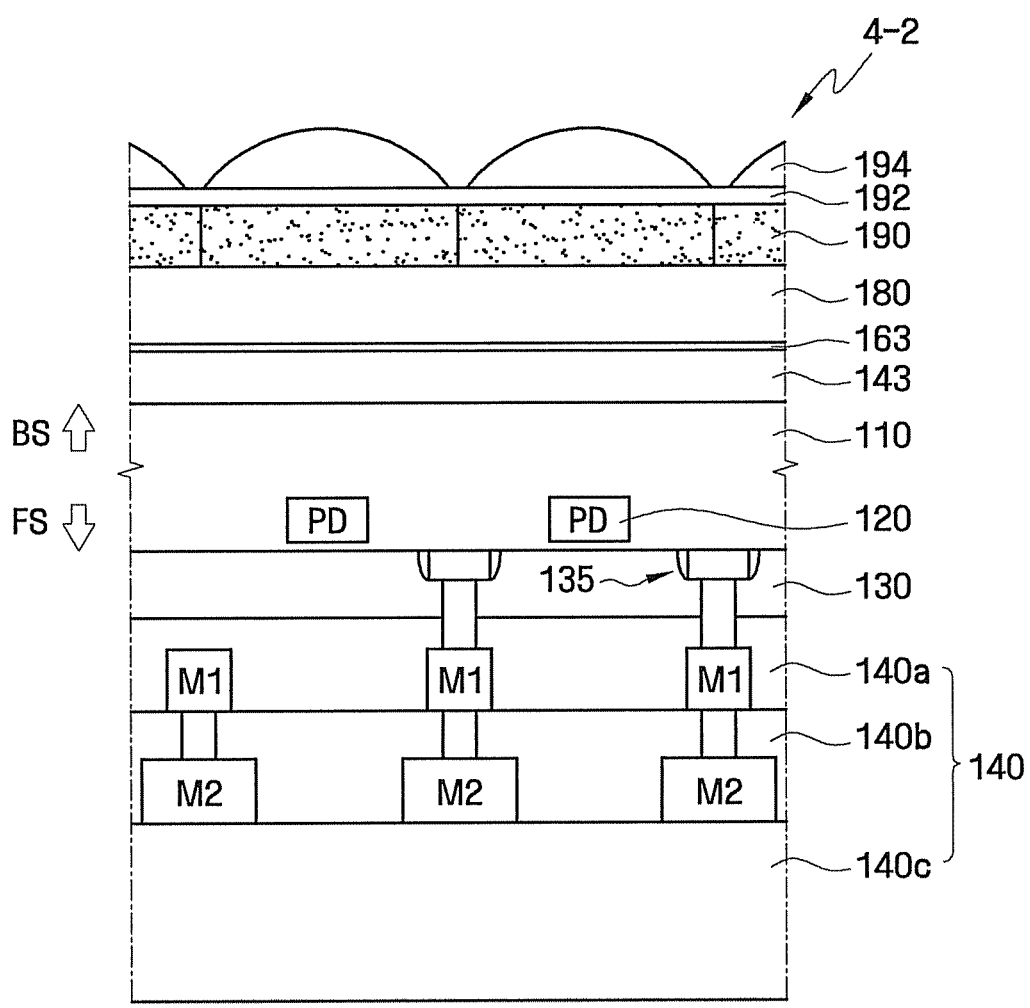

According to an image sensor 3_2 illustrated in FIG. 6B, on a sensor array region I of a substrate 110 a structure of FIG. 6A is formed, and on a peripheral circuit region II an interlayer dielectric layer 130, the interconnection structure 140, and the moisture absorption barrier layer 162 can be formed. As described above, the moisture absorption barrier layer 162 can be formed on a part of or an entire substrate 110. Therefore, on the sensor array region I and the peripheral circuit region II the moisture absorption barrier layer 162 having an identical thickness and material can be formed. Referring to FIGS. 7A and 7B, image sensors 4_1 and 4_2 according to another example embodiment are described. FIGS. 7A and 7B are sectional views illustrating the image sensors 4_1 and 4_2 according to another example embodiment. To aid understanding, FIGS. 7A and 7B mainly illustrate a part of a sensor array region with a photoelectric transformation device as a center.

Referring to FIG. 7A, an image sensor 4_1 according to another example embodiment is differentiated from others such that light enters through a backside of a substrate. Such image sensor is called a backside illuminated image sensor. Since in the backside illuminated image sensor metal interconnections M1 and M2 are not formed on the side through which light enters, incident light does not get reflected by the metal interconnections M1 and M2. Also, light is not absorbed by an interlayer dielectric layer 130 and an interconnection structure 140.

Referring to FIG. 7A, a photoelectric transformation device 120 is formed inside a substrate 110, and on a front side FS of the substrate 110 the interlayer dielectric layer 130, intermetal dielectric layers 140a, 140b, and 140c, and the interconnection structure 140 including the metal interconnections M1 and M2 are formed. On a backside BS of the substrate 110 a backside interlayer dielectric layer 143 is formed, and on an entire backside interlayer dielectric layer 143 a moisture absorption barrier layer 163 is formed. Thus, the moisture absorption barrier layer 163 is formed on the BS of the substrate 110.

Referring to FIG. 7B, unlike the image sensor 4_1 illustrated in FIG. 7A, on a moisture absorption barrier layer 163 an adhesive layer 180 can be formed. The adhesive layer 180 allows a color filter 190 to be bonded on the moisture absorption barrier layer 163 stably.

Hereinafter, referring to FIGS. 8 through 11 and FIG. 4, a method of fabricating an image sensor according to an example embodiment is described. FIGS. 8 through 11 are sectional views of structures of intermediate steps illustrating a method of fabricating an image sensor according to an example embodiment. To aid understanding, the following mainly illustrates a photoelectric transformation device and part of sensor array region, and the content that is practically identical to that previously described is skipped or simplified.

Figure 8:
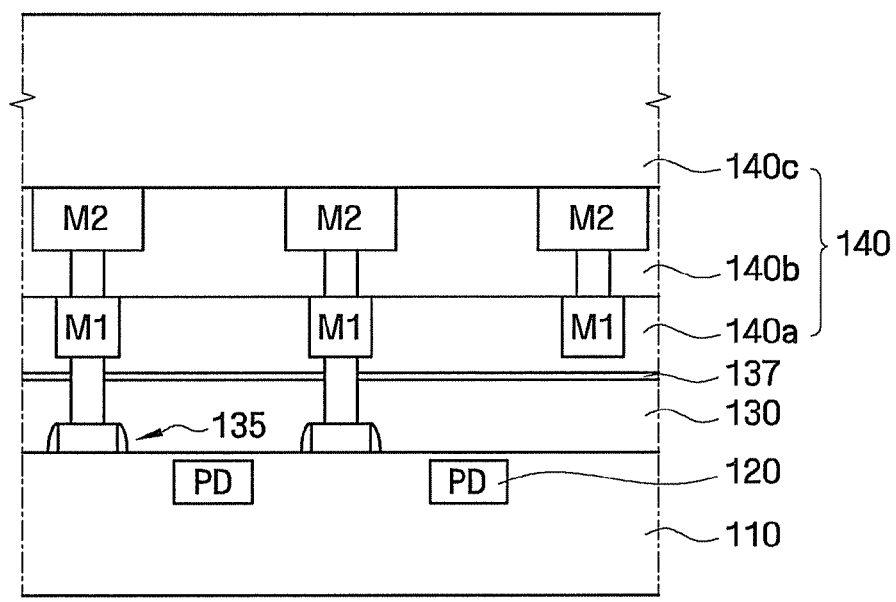
FIGS. 8 through 11 are sectional views of structures of intermediate steps illustrating a method of fabricating an image sensor according to an example embodiment.

Referring to FIG. 8, a substrate 110 including a photoelectric transformation device 120 formed inside is provided, and on the substrate 110 an interconnection structure 140 including multiple layers of intermetal dielectric layers 140a, 140b, and 140c and multiple layers of metal interconnections M1 and M2 placed in the multiple layers of the intermetal dielectric layers 140a, 140b, and 140c are formed.

As illustrated in FIG. 8, before forming the interconnection structure 140, an interlayer dielectric layer 130 including multiple gate structures inside can be formed. For example, the gate structure can be a transistor, and the gate structure illustrated in the drawing can be a charge transmission device 135.

The interconnection structure 140 including the multiple intermetal dielectric layers 140a, 140b, and 140c and the multiple metal interconnections M1 and M2 placed inside the multiple intermetal dielectric layers 140a, 140b, and 140c, for example can be formed by using a damascene process. Therefore, although not illustrated in the drawings, for example, a diffusion barrier layer can be included between the multiple intermetal dielectric layers 140a, 140b, and 140c. Furthermore, forming the multiple metal interconnections M1 and M2 can include forming a copper interconnection or an aluminum interconnection; however, it is not limited thereto.

Figure 9:
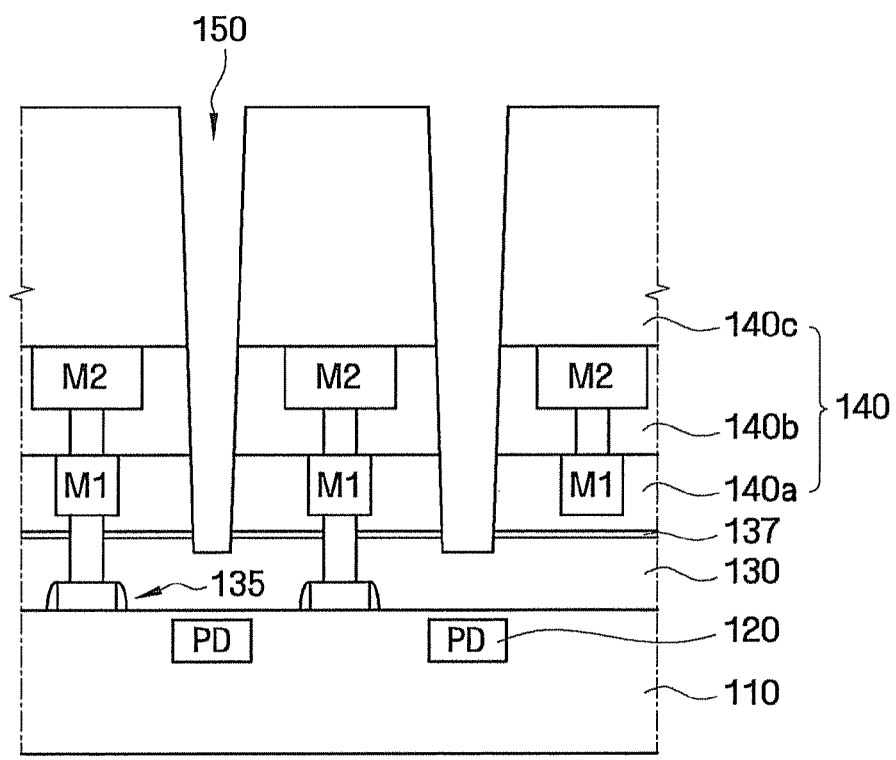

Next, referring to FIG. 9, a cavity 150 which is aligned along the photoelectric transformation device 120 and penetrates the interconnection structure 140 is formed.

Specifically, since an interface exists between the multiple intermetal dielectric layers 140a, 140b, and 140c and the interlayer dielectric layer 130 formed in multiple layers, such surface can prevent incident light provided by a color filter 190 from arriving at the photoelectric transformation device 120. Therefore, forming the cavity 150 that penetrates the interconnection structure 140 on the photoelectric transformation device 120 can minimize the obstruction factors. As a result, the quantity of incident light arriving at the photoelectric transformation device 120 can be increased, and also photosensitivity can be increased.

Furthermore, as illustrated in FIG. 9, the cavity 150 can be formed such that it penetrates part of the interlayer dielectric layer 130 and an etch stop layer 137 formed between the interlayer dielectric layer 130 and the multiple intermetal dielectric layer 140a, 140b, and 140c. In this case, the cavity 150 can be formed by using two step etch processes.

More specifically, this step can be divided into two steps. The first step etch forms an intermediate cavity (not shown) by etching the interconnection structure 140 to penetrate the multiple intermetal dielectric layers 140a, 140b, and 140c and stopping etch at the etch stop layer 137, and the second step etch performs etching the interlayer dielectric layer 130 under the etch stop layer 137 after removing the etch stop layer 137 by controlling process condition, for example etch execution time. By controlling the degree of etch of the interlayer dielectric layer 130 under the etch stop layer 137, the depth of the cavity 150 can be controlled. Furthermore, the cavity 150 can penetrate the interlayer dielectric layer 130 completely.

For example, the cavity can be formed by using a plasma etch process; however, it is not limited thereto.

Figure 10:
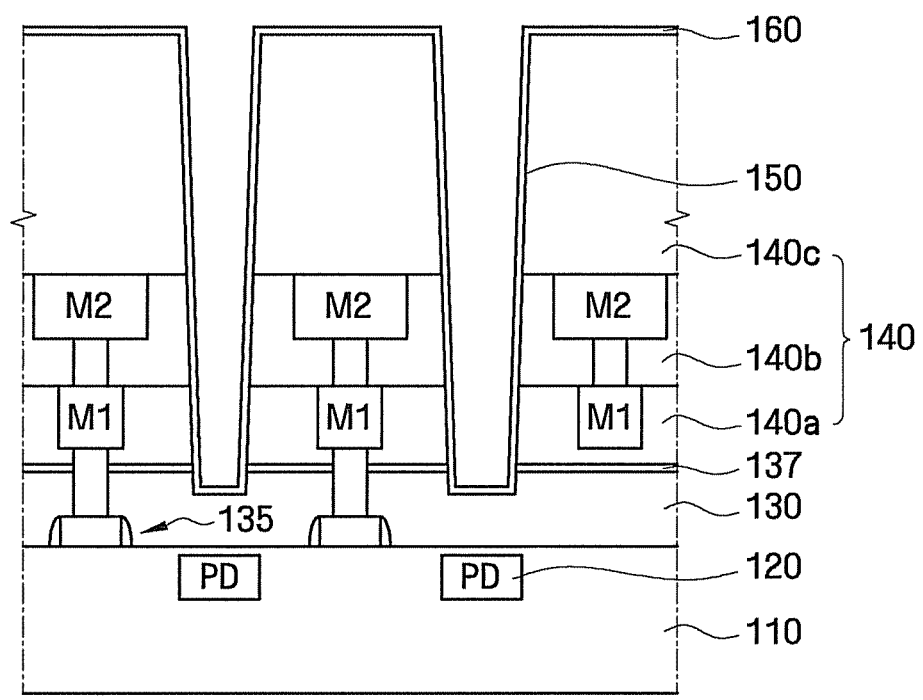

Next, referring to FIG. 10, on the cavity 150 a moisture absorption barrier layer 160 can be formed conformally.

For example, by performing Atomic Layer Deposition (ALD), the moisture absorption barrier layer 160 can be formed conformally on both the sidewalls and bottom of the cavity 150 formed inside the interconnection structure 140. As illustrated in FIG. 10, by performing the ALD process on an entire substrate 110 having the cavity formed, the moisture absorption barrier layer 160 can be formed not only on both sidewalls and a bottom of the cavity 150, but also on the intermetal dielectric layer 140c, a top of the metal interlayer dielectric layer 140c.

The ALD process has superior step coverage, and can form the moisture absorption barrier layer 160 while maintaining the profile of the cavity 150 substantially identical. Thus, an aspect ratio after forming the moisture absorption barrier layer 160 and an aspect ratio before forming the moisture absorption barrier layer 160 can be maintained almost identically, and the low luminance characteristics due to the aspect ratio increase can be improved. Therefore, when forming the moisture absorption barrier layer 160, material which can be applied to an ALD process, for example aluminum oxide or titanium oxide can be used. Furthermore, the moisture absorption barrier layer 160 can be formed, for example with a thickness of between about 1 Å and about 2,000 Å.

Furthermore, by forming the moisture absorption barrier layer 160 by using the ALD process, compared to forming it by using a plasma treatment, stress to a device can be minimized and a dark level can be improved.

Figure 11:
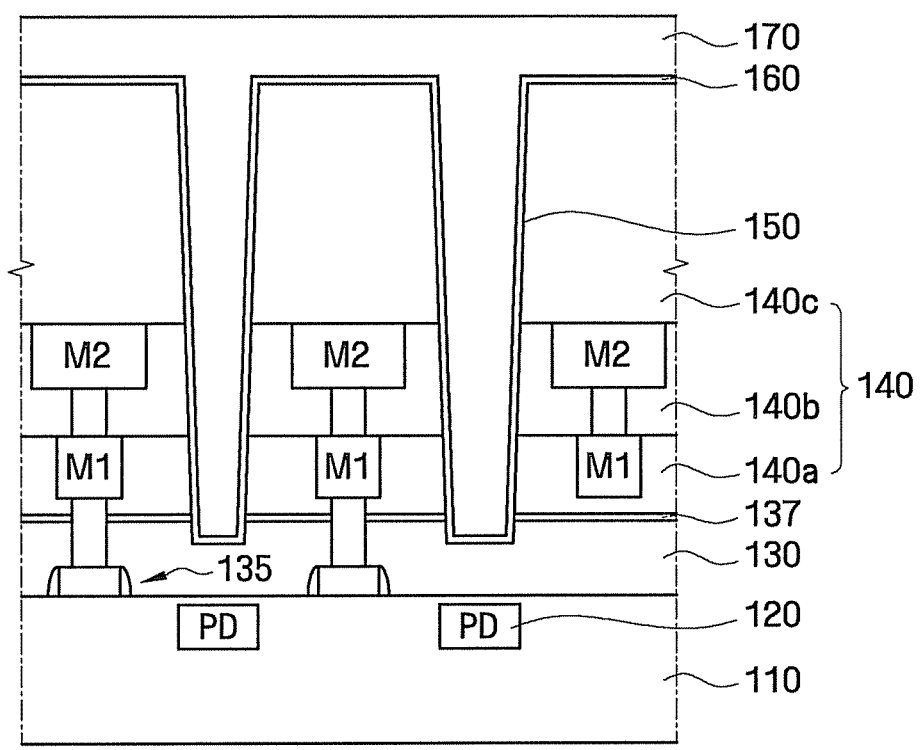

Next, referring to FIG. 11, by forming light penetration material on the moisture absorption barrier layer 160 a light guide unit that fills the cavity 150 is formed.

For the light penetration material, for example, organic polymer compound such as fluoropolymer (Cytop™) having a ring structure, polysiloxane resin, titanium oxide, and PMMA polymer can be used; however, it is not limited thereto. Here, the light penetration material, for example, can be formed by using a spin coating method; however, it is not limited thereto. Furthermore, as illustrated in FIG. 11, the light penetration material can be formed to fill the cavity 150 and to be extended to on the intermetal dielectric layer 140c, a top of the interconnection structure 140.

Again, referring to FIG. 4A, on the light penetration material of the light guide unit 170 a lower planarization layer 180, the color filter 190, an upper planarization layer 192, and a lens 194 can be formed sequentially. Here, although not shown in the drawings, on the lens 194 a protection layer can be formed additionally.

Also, referring to FIG. 4B, after filling the cavity 150 with the light penetration material, the light penetration material is removed until the moisture absorption barrier layer 160 is exposed, and on the exposed moisture absorption barrier layer 160 and the light penetration material inserted inside the cavity 150 a lower planarization layer 180 can be formed.

According to a method of fabricating an image sensor in accordance with an example embodiment, by forming a moisture absorption barrier layer on an interconnection structure including the cavity formed, deterioration of a saturation level of a sensor array can be prevented. Thus, an image sensor with improved reliability can be fabricated. Also, when an ALD process is used to form the moisture absorption barrier layer, stress to a device can be minimized and a dark level generation issue can be improved. Also, by forming the moisture absorption barrier layer with a uniform thickness, an image sensor with improved low luminance characteristics can be fabricated.

Figure 12:
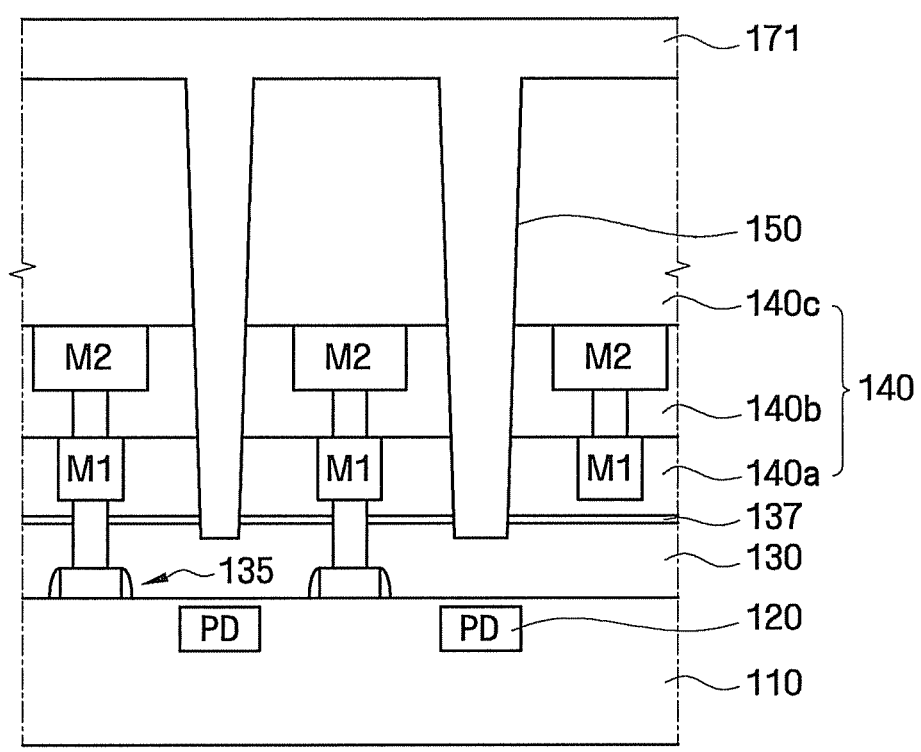
FIGS. 12 and 13 are sectional views of structures of intermediate steps illustrating a method of fabricating an image sensor according to another example embodiment.
Figure 13:
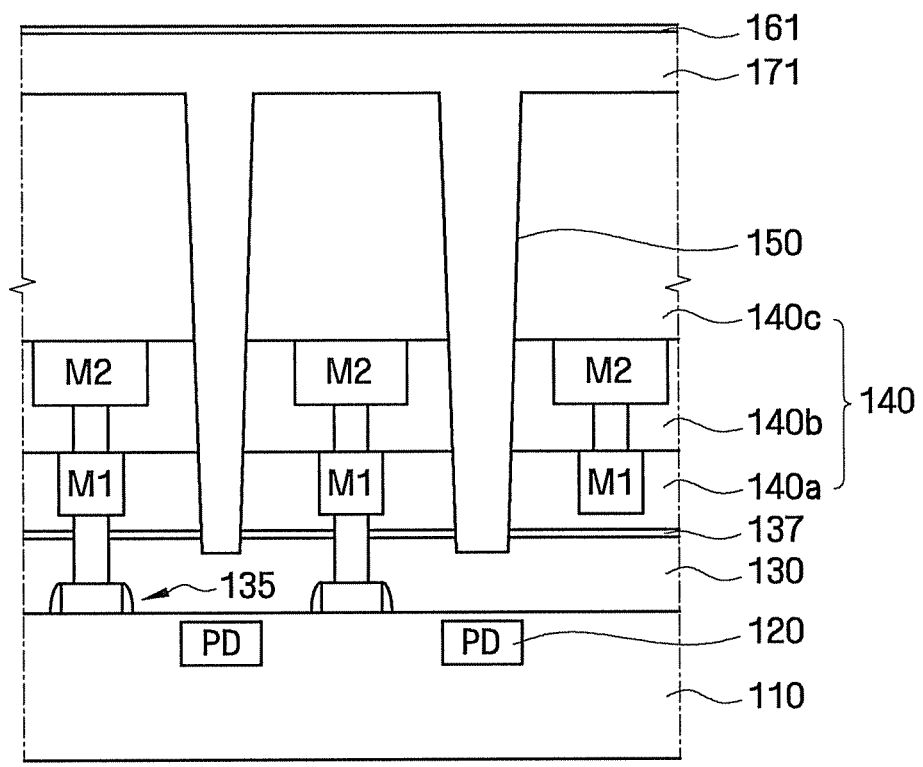

Hereinafter, referring to FIGS. 12, 13, and 5, a method of fabricating an image sensor according to another example embodiment is described. FIGS. 12 and 13 are sectional views of structures of intermediate steps illustrating a method of fabricating an image sensor according to another example embodiment.

The steps of the method of fabricating an image sensor according to another example embodiment may include the step that corresponds to FIG. 9 of the method of fabricating the image sensor according an example embodiment. Thus, descriptions are focused on the steps afterward.

Referring to FIG. 12, by filling a cavity 150 with light penetration material a light guide unit 171 is formed. Thus, the light penetration material can be formed directly on an interconnection structure 140 including the cavity 150.

Next, referring to FIG. 13, on the light penetration material of the light guide unit 171 a moisture absorption barrier layer 161 is formed. Specifically, the moisture absorption barrier layer 161, for example, can be formed on an entire substrate 110 including the light guide unit 171 formed by using an ALD process.

Next, as illustrated in FIG. 5, on the moisture absorption barrier layer 161 a color filter 190, a planarization layer 192, and a lens 194 can be formed sequentially. Furthermore, although not shown in the drawings, on the lens 194 a protection layer 196 can be formed. Also, on the bottom of the color filter 190 a lower planarization layer can be formed additionally.

Descriptions of a method of fabricating the image sensor according to another example embodiment discussed below are explained briefly since the descriptions can be inferred from the method of fabricating the image sensor according to the previously described example embodiment by those who skilled in this art.

A method of fabricating an image sensor according to another example embodiment is described shortly. First, as illustrated in FIG. 8, after forming an interconnection structure 140 on a substrate 110 within which a photoelectric transformation device 120 is formed, as illustrated in FIG. 6, a moisture absorption barrier layer 162 is formed on an entire substrate 110 including the interconnection structure 140. The characteristics and formation process of the moisture absorption barrier layer 162 may be the same as the examples described above including, for example, the example illustrated in FIG. 10.

In case of a method of fabricating an image sensor according to another example embodiment, unlike methods of fabricating image sensors according to previous examples, including for example, the example process illustrated in FIGS. 8-11, a step to form a cavity inside an interconnection structure 140 (refer to 150 of FIG. 5) is not included. Thus, on the interconnection structure 140 without including a cavity 150 a moisture absorption barrier layer 162 is formed.

Hereinafter, referring to FIGS. 14 through 17 and FIG. 7, a method of fabricating an image sensor according to another example embodiment. FIGS. 14 through 17 are sectional views of structures of intermediate steps illustrating a method of fabricating an image sensor according to another example embodiment.

Figure 14:
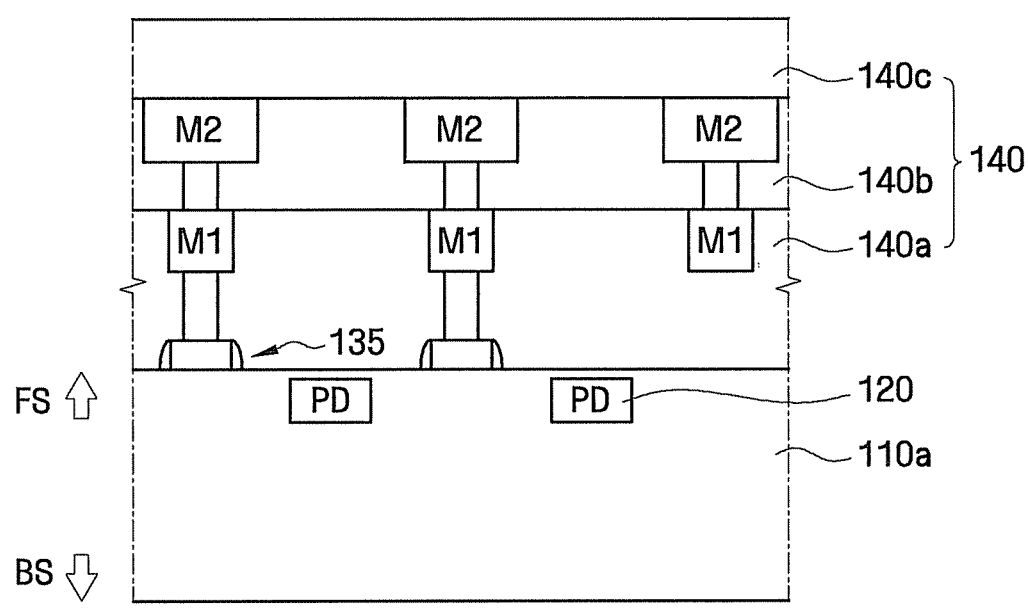
FIGS. 14 through 17 are sectional views of structures of intermediate steps illustrating a method of fabricating an image sensor according to another example embodiment.

Referring to FIG. 14, a substrate 110 including a photoelectric transformation device 120 formed in a part which is adjacent a first surface, that is, front surface FS a photoelectric transformation device 120 formed is provided, and on the FS of the substrate 110 an interconnection structure 140 including multiple intermetal dielectric layers 140a, 140b, and 140c and multiple metal interconnection M1 and M2 is formed.

Figure 15:
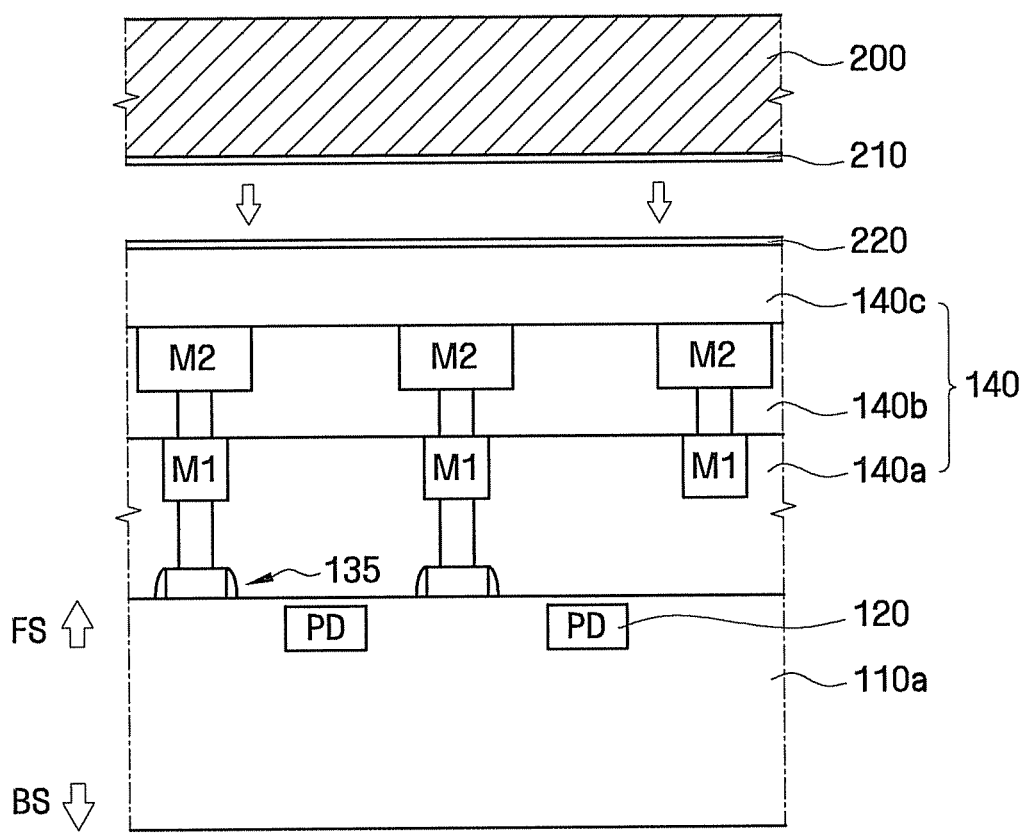

Referring to FIG. 15, on the interconnection structure 140 a support substrate 200 is attached to support the substrate 110. In this step, as illustrated in FIG. 15, a first bonding layer 210 is formed on one side of the support substrate 200 and a second bonding layer 220 is formed on the interconnection structure 140 to bond the support substrate 200 to the interconnection structure 140 stably. For example, the bonding layer can be formed only on one of the support substrate 200 and the interconnection structure 140, and also the support substrate 200 can be attached on the interconnection structure 140 by using various methods.

Figure 16:
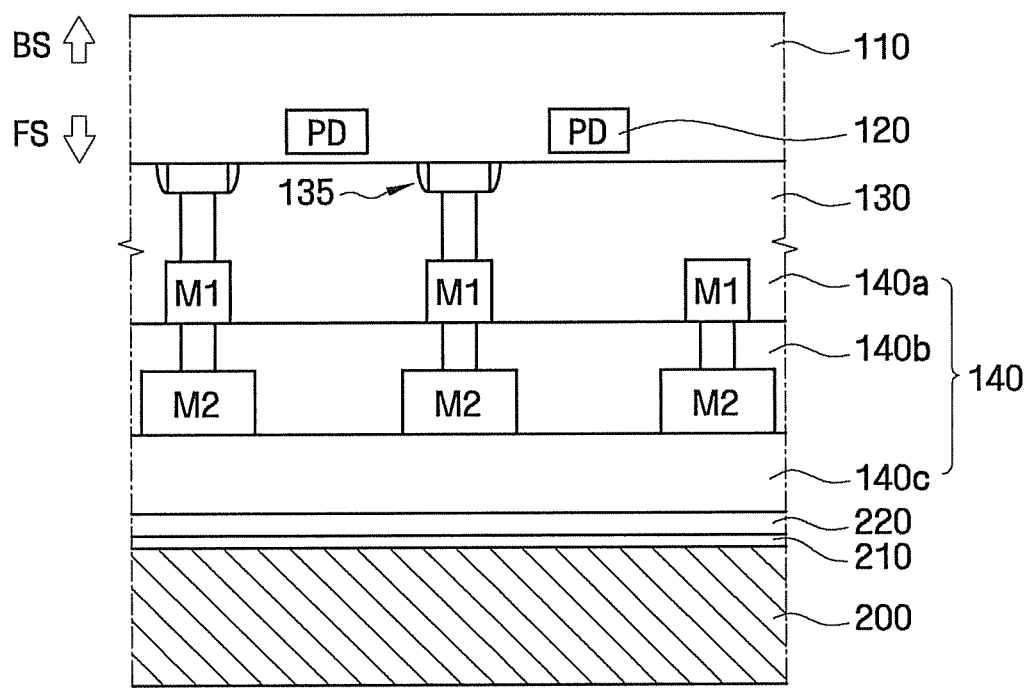

Referring to FIG. 16, the top and bottom of substrate 110 including the support substrate 200 attached are reversed. Thus, by reversing the top and bottom of the substrate 110 the photoelectric transformation device 120 is placed on top of the interconnection structure 140.

Next, a part of a backside BS of the substrate 110 including the support substrate 200 attached can be removed. Specifically, by using an etch process (for example, reactive ion etching) or polishing process (for example, CMP (Chemical Mechanical Polishing), BGR (Back Grinding)) the part of the BS of substrate 110 can be removed. By removing the part of the BS of the substrate 110 the thickness of the substrate 110 is reduced, and a path of incident light entering the photoelectric transformation device 120 is reduced. As a result, the photosensitivity of the photoelectric transformation device 120 can be improved.

Figure 17:
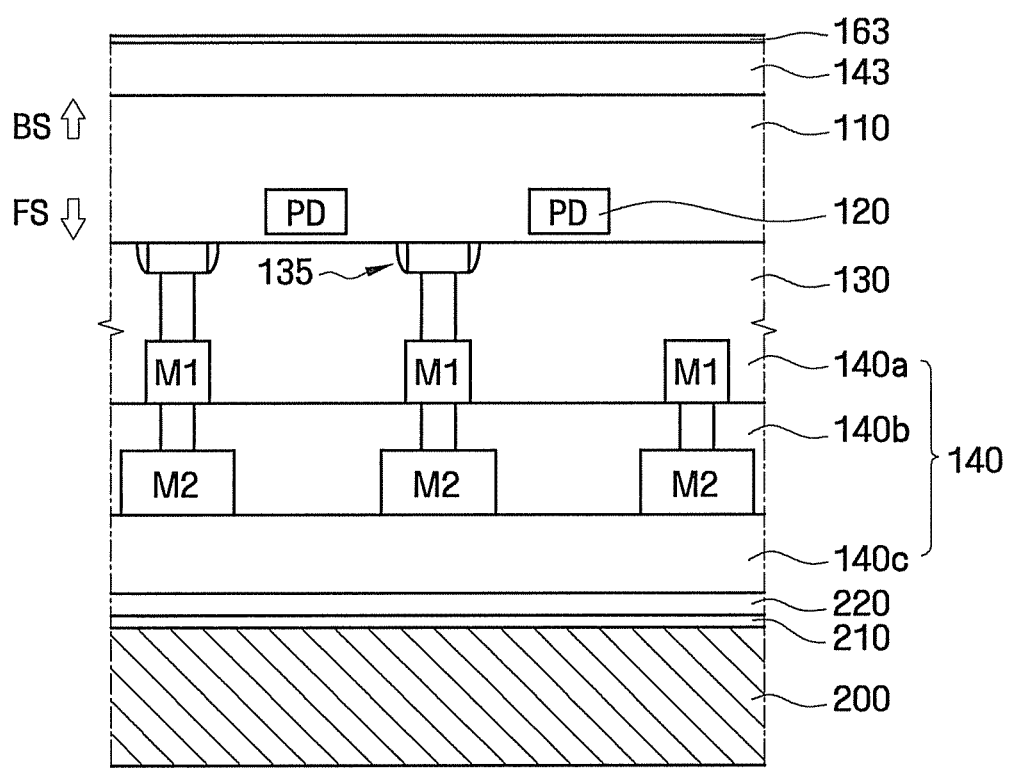

Referring to FIG. 17, on the entire second surface, that is, the BS of the substrate 110 backside intermetal dielectric layer 143 is formed, and on the entire BS of the substrate 110 where a backside intermetal dielectric layer 143 is formed a moisture absorption barrier layer 163 is formed.

The backside intermetal dielectric layer 143 is formed by vapor depositing dielectric material such as a silicon oxide layer or a silicon nitride layer on the BS of the substrate 110. For example, chemical vapor deposition or atomic vapor deposition can be used; however, it is not limited thereto. Also, since the method of forming the moisture absorption barrier layer 163 may be the same as the examples described above including, for example, the example illustrated in FIG. 10a detailed description is skipped.

Again, referring to FIG. 7, on the BS of the substrate 110 where the backside intermetal dielectric layer 143 and the moisture absorption barrier layer 163 are formed a color filter 190, a planarization layer 192, and a lens 194 can be formed sequentially. Furthermore, although not shown in the drawings, on the lens 194 a protection layer can be formed additionally. Also, on the bottom of the color filter 190 a lower planarization layer can be formed additionally.

Figure 18:
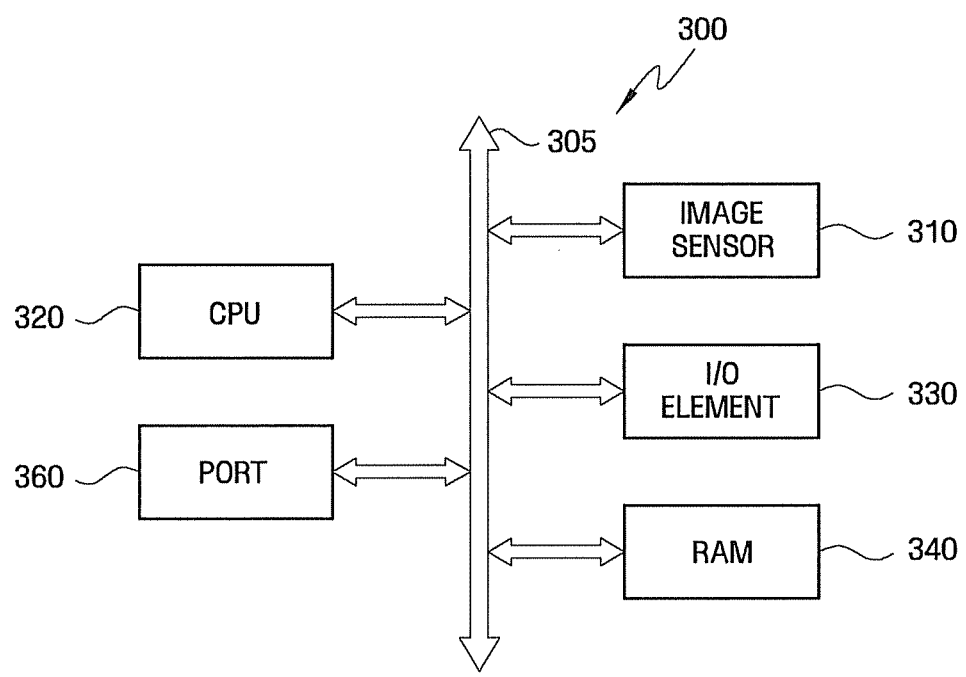
FIGS. 18 through 20 are processor-based devices including an image sensor according to example embodiments.
Figure 19A:
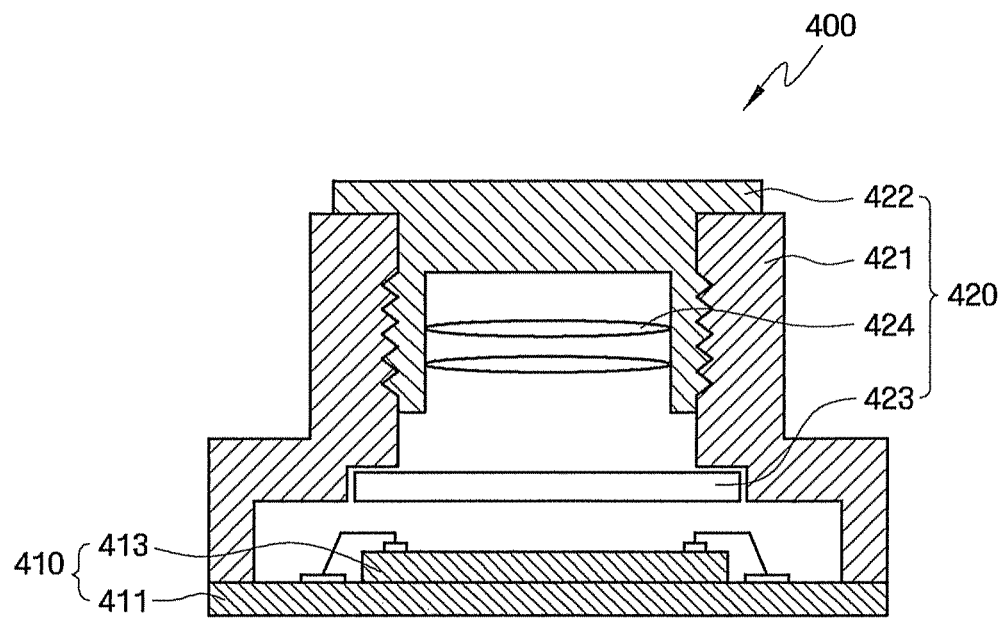
Figure 19B:
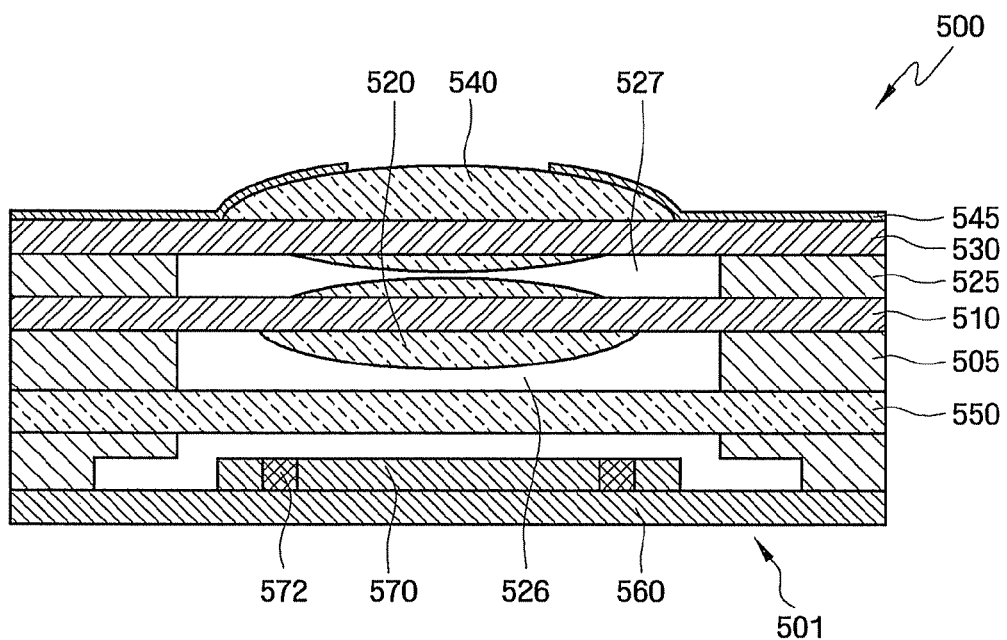
Figure 20:
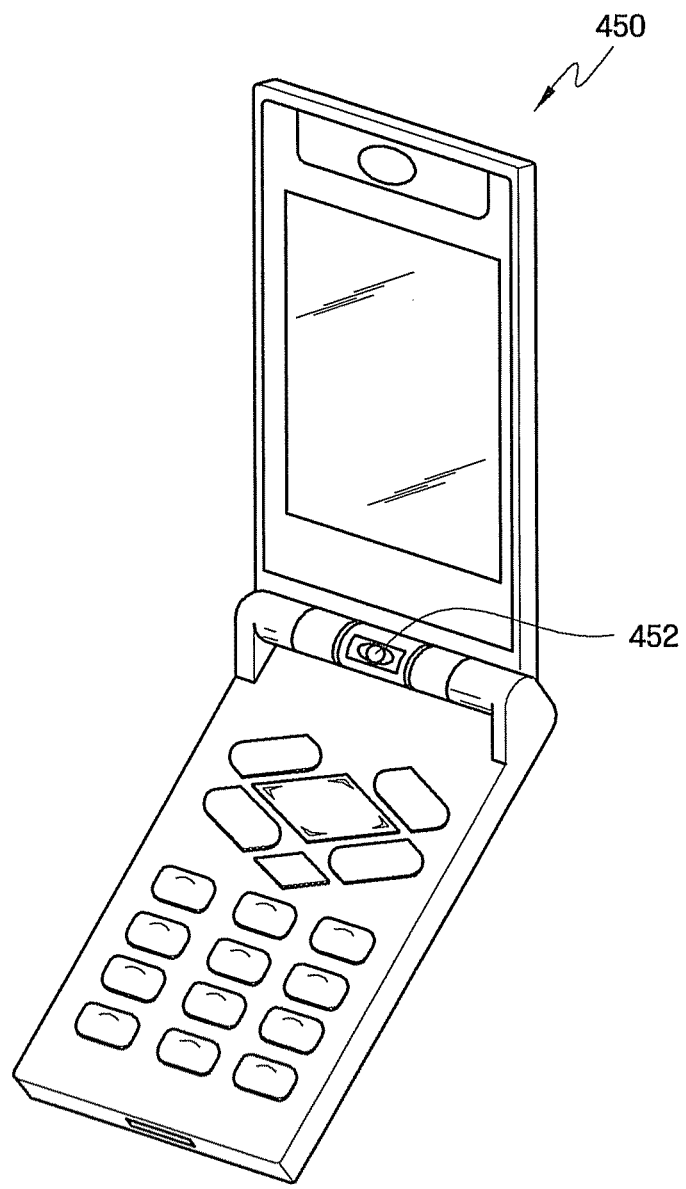

Hereinafter, referring to FIGS. 18 through 20, processor-based equipments including image sensors according to example embodiments are described. FIG. 18 illustrates computer equipment. FIGS. 19A and 19B illustrate camera equipment. FIG. 20 illustrates a cellular phone. It is obvious that besides the previously mentioned equipment, the image sensors according to example embodiments can be used in other equipment (for example, scanner, mechanized clock equipment, navigation equipment, video phone, supervision equipment, auto focus equipment, trace equipment, surveillance equipment, image stabilization equipment, and so forth)

Referring to FIG. 18, computer equipment 300 includes a Central Processing Unit CPU 320 such as a microprocessor that can communicate with I/O devices through a bus 305. An image sensor 310 can communicate with equipment through the bus 305 or other communication links. Also, the processor-based equipment 300 can additionally include a RAM 340 and/or a port 360 that can communicate with the CPU 320 through the bus 305. The port 360 can be coupled with for example, one or more of a video card, a sound card, a memory card, and a USB device, or can perform data communication with other equipment. The image sensor 310 can be integrated into a chip with CPU, Digital Signal Processor (DSP), or microprocessor. Also, memory can be integrated together; however, it can be integrated into a separate chip without processor.

Referring to FIG. 19A, camera equipment 400 includes an image sensor package 410 where an image sensor 413 is mounted on a circuit board 411 through bonding wires. Also, on the circuit board 411 a housing 420 is attached, the housing 420 protects the circuit board 411 and the image sensor 413 from external environment.

In the housing 420, a lens barrel 421 where pictures to be taken passes through is formed. On an exterior wall of the lens barrel 421 that faces outside a protection cover 422 can be installed, and on an interior wall of the lens barrel 421 an infrared block and reflection prevention filter 423 can be installed. Also, inside the lens barrel 421 a lens 424 is mounted and the lens 424 can move along a spiral groove of lens barrel 421.

Referring to FIG. 19B, camera equipment 500 uses an image package sensor 501 that uses a through via 572. When using the through via 572, an image sensor 570 and a circuit board 560 can be electrically connected without using wire bonding.

A reference number 520 that is not described here represents a first lens, and a reference number 540 represents a second lens. Also, a reference number 526 and a reference number 527 represent lens components. Also, a reference number 505 represents a support member, a reference number 545 represents an aperture, a reference number 510 and a reference number 530 represent transparent substrates, and a reference number 550 represents a glass.

Referring to FIG. 20, an image sensor 452 is attached to a predetermined location of a cell phone system 450. It is obvious for those skilled in the art that the image sensor 452 can be attached to other locations than that illustrated in FIG. 20.

More detailed descriptions of example embodiments are described by using the following specific experimental examples, and the content not described here is skipped since those skilled in the art can technically infer it without difficulty.

EXPERIMENTAL EXAMPLE 1

In this comparative experimental example, after forming a cavity and after exposing the image sensor where a light guide unit was formed by filling light penetration material directly on the cavity to 85% humidity and a temperature of 85° C., the saturation level of image sensor was measured.

In this experimental example, after forming a cavity followed by forming a nitride layer on the cavity and after exposing the image sensor where a light guide unit was formed by spreading light penetration material over the nitride layer to fill the cavity to 85% humidity and a temperature of 85° C., the saturation level of image sensor was measured.

Figure 21A:
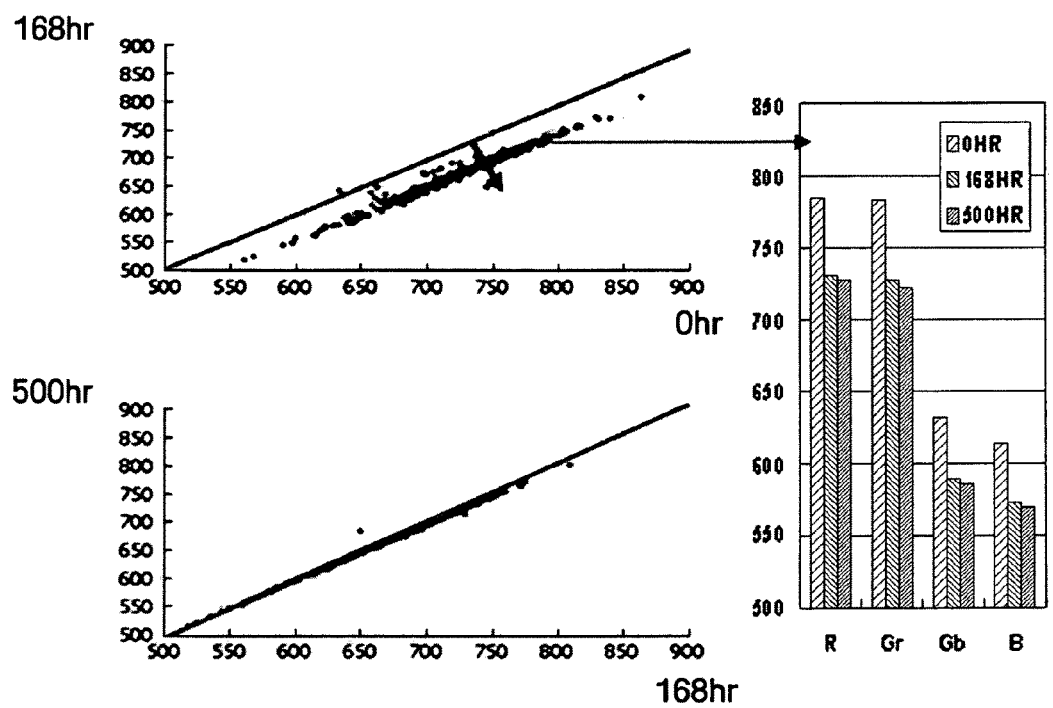
FIGS. 21A through 22 are graphs illustrating results of Experimental Examples.
Figure 21B:
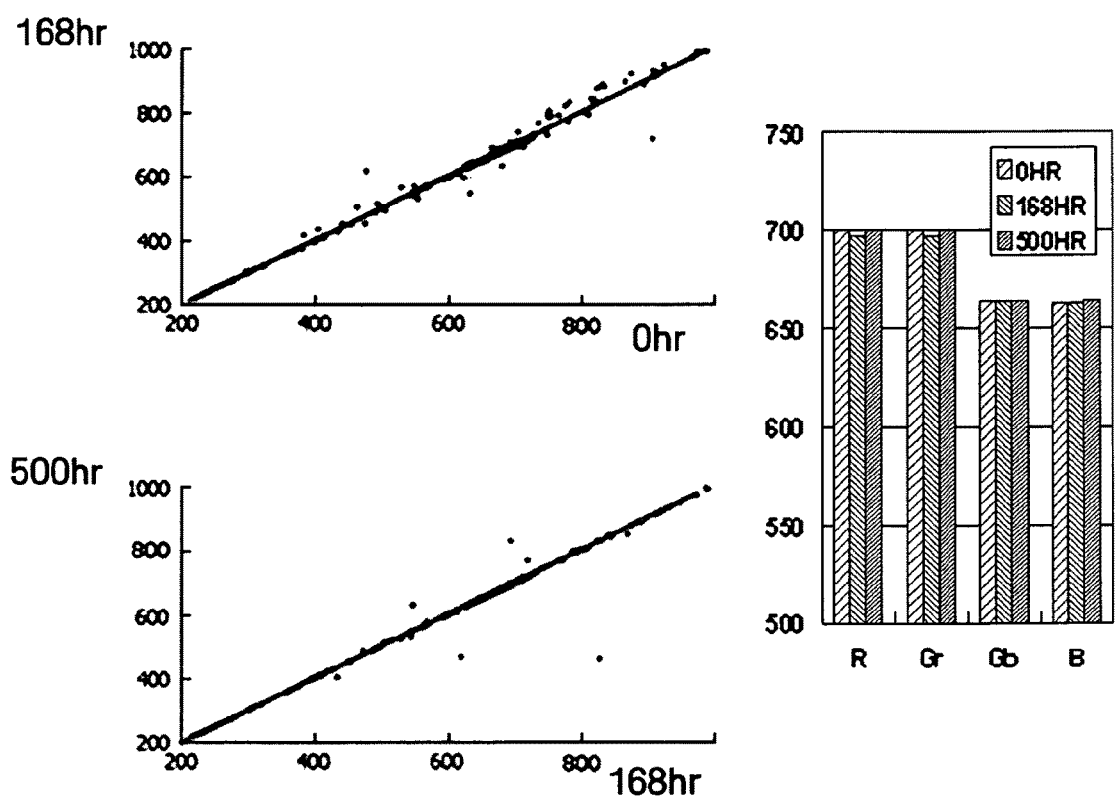

The results were illustrated in FIGS. 21A and 21B. FIG. 21A showed the saturation level of the sensor array measured for the image sensor used in the comparative experimental example before 0 hour exposure (0 HR), after 168 hours (168 HR) exposure, and after 500 hours exposure (500 HR) to the previously mentioned humidity and temperature in LSB (least significant bit) (code unit).

As illustrated in the left bar graphs of FIGS. 21A and 21B, the saturation level of the comparative experimental example showed that compared to the value before exposure to the previously mentioned humidity and temperature, saturation deterioration of an approximately 100 LSB code occurred after 168 hr exposure. However, the saturation level of the experimental example showed that after 168 hr and 500 hr exposure very little saturation level deterioration occurred.

EXPERIMENTAL EXAMPLE 2

In the comparative experimental example A(a), after forming a cavity, a light guide unit was formed by filling light penetration material directly on the cavity and the dark level (DK level) of output signal was measured.

In the comparative experimental example B(b), after forming a cavity, a nitride layer with a thickness of 5,000 Å was formed on the cavity by using a plasma treatment, and a light guide unit was formed by filling light penetration material on the nitride layer. Then, the dark level of output signal was measured.

In the comparative experimental example C(c), after forming a cavity, a nitride layer with a thickness of 4,000 Å was formed on the cavity by using plasma treatment, and a light guide unit was formed by filling light penetration material on the nitride layer. Then, the dark level of output signal was measured.

In the experimental example D(d), after forming a cavity, an aluminum oxide layer with a thickness of 50 Å was formed by performing ALD process, and a light guide unit was formed by filling light penetration material on the aluminum oxide layer. Then, the dark level of output signal was measured.

In the experimental example E(e), after forming a cavity, an aluminum oxide layer with a thickness of 100 Å was formed by performing ALD process, and a light guide unit was formed by filling light penetration material on the aluminum oxide layer. Then, the dark level of output signal was measured.

Figure 22:
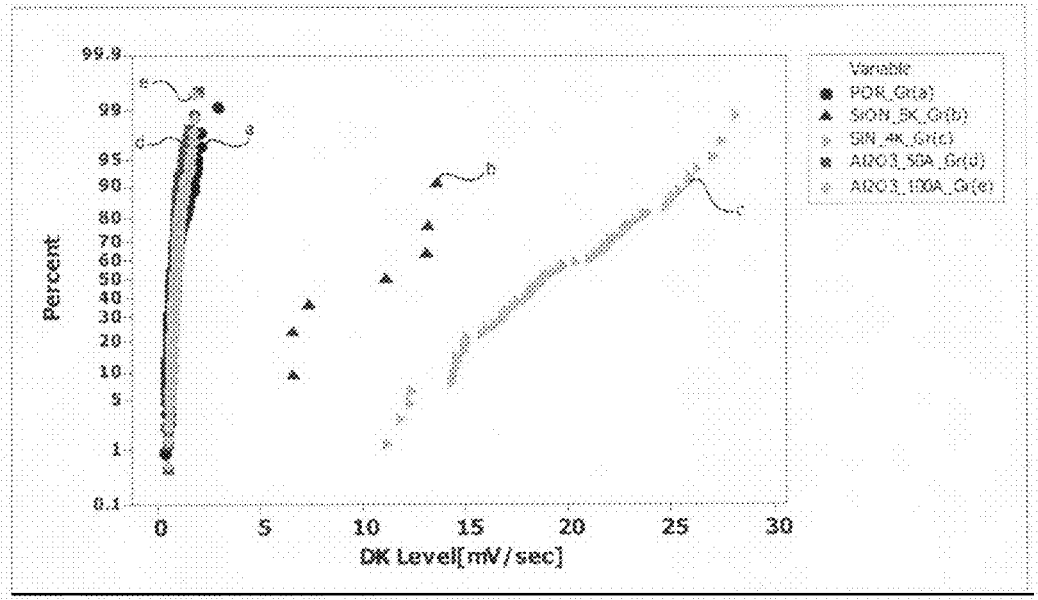

The results were illustrated in FIG. 22. As illustrated in FIG. 22, in the comparative experimental examples B(b) and C(c) where a nitride layers were formed by using plasma treatment the dark level value was greater than 5 mV/sec. However, in the experimental examples D(d) and E(e) the dark level value was maintained below about 2.5 mV/sec.

The dark level value of the comparative experimental example A(a) was similar to the dark level value of experimental examples. As illustrated in the experimental example 1, deterioration of the saturation level occurred when forming light penetration material directly on the cavity (the comparative experimental example of the experimental example 1), and it was observed that forming a layer on the cavity as illustrated in the comparative experimental examples B, C and the experimental examples A, B prevented deterioration of saturation level.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. An image sensor comprising:
   a substrate including at least a first and second photoelectric transformation device;
   an interconnection structure on the substrate, the interconnection structure including one or more intermetal dielectric layers, the interconnection structure defining at least a first cavity and a second cavity such that the first and second cavities are aligned corresponding to the first and second photoelectric transformation devices, respectively, and each of the first and second cavities has at least two side portions and bottom portion;
   a moisture absorption barrier layer on a top surface of a top one of the one or more intermetal dielectric layers of the interconnection structure and inside the first and second cavities;
   a light guide unit on the moisture absorption barrier layer, the light guide unit including a light transmittance material filling the first and second cavities; and
   a color filter on the light guide unit,
   wherein the color filter is located above the first and second cavities and outside the first and second cavities,
   wherein the moisture absorption barrier layer has a uniform thickness along the two side portions and the bottom of the first and second cavities, and on a top surface of the top intermetal dielectric layer in a first region, the first region being a portion of the top intermetal dielectric layer beginning at the first cavity and ending at the second cavity, and
   wherein, in the first region, the moisture absorption barrier layer is directly above the top surface of the top intermetal dielectric layer such that no intervening layers exist in between the top surface of the top intermetal dielectric layer and the moisture absorption barrier layer.

2. The image sensor of claim 1, wherein the moisture absorption barrier layer includes an aluminum oxide layer or a titanium oxide layer.

3. The image sensor of claim 1, wherein the thickness of the moisture absorption barrier layer is about 1 Å to about 2,000 Å.

4. The image sensor of claim 1, wherein the moisture absorption barrier layer is formed by an Atomic Layer Deposition (ALD) process.

5. The image sensor of claim 1, wherein the light transmittance material extends along an upper side of the intermetal dielectric layer which is a top layer of the interconnection structure.

6. The image sensor of claim 1, further comprising:
an interlayer dielectric layer between the interconnection structure and the substrate;
a gate structure in the interlayer dielectric layer and electrically connected to one or more metal interconnections in the one or more intermetal dielectric layers; and
an etch stop layer on the interconnection structure, wherein the etch stop layer, a part of the interlayer dielectric layer and the interconnection structure define the cavity.

7. The image sensor of claim 1, wherein the one or more intermetal dielectric layers include one or more metal interconnections, and the one or more metal interconnections are multiple copper interconnections, the interconnection structure includes a diffusion barrier layer between each of the one or more intermetal dielectric layers, and the cavity is defined by the interconnection structure and the diffusion barrier layers.

8. An image sensor comprising:
a substrate including a photoelectric transformation device;
an interconnection structure on the substrate, the interconnection structure including one or more intermetal dielectric layers and one or more metal interconnections in the one or more intermetal dielectric layers, the interconnection structure defining at least a first cavity such that the first cavity is aligned corresponding to the photoelectric transformation device;
an interlayer dielectric layer between the interconnection structure and the substrate, the interlayer dielectric layer including a gate structure electrically connected to the one or more metal interconnections;
a moisture absorption barrier layer above the substrate and the interconnection structure;
a color filter directly on the moisture absorption barrier layer; and
a light guide unit including light transmittance material,
wherein,
the color filter is located above the first cavity and outside the first cavity,
the light guide unit includes light transmittance material which fills the cavity and extends along a space between the interconnection structure and the moisture absorption barrier layer, and
a refractive index of the light transmittance material is higher than a refractive index of the multiple intermetal dielectric layers.

9. The image sensor of claim 8, further comprising an etch stop layer between the interconnection structure and the interlayer dielectric layer, wherein the etch stop layer, a part of the interlayer dielectric layer, and the interconnection structure define the cavity.

10. The image sensor of claim 8, wherein the moisture absorption barrier layer is formed by an Atomic Layer Deposition (ALD) process.

11. The image sensor of claim 8, wherein the moisture absorption barrier layer is formed with an aluminum oxide layer or a titanium oxide layer.

12. The image sensor of claim 8, wherein the thickness of the moisture absorption barrier layer is within the range 1 Å to 2,000 Å.

* * * * *